US008758656B2

(12) United States Patent
Nishikawa et al.

(10) Patent No.: US 8,758,656 B2
(45) Date of Patent: Jun. 24, 2014

(54) PROCESS FOR PRODUCING GRAPHITE FILM AND GRAPHITE FILM PRODUCED THEREBY

(75) Inventors: Yasushi Nishikawa, Takatsuki (JP); Shuhei Wakahara, Settsu (JP); Mutsuaki Murakami, Settsu (JP)

(73) Assignee: Kaneka Corporation, Osaka (JP)

( * ) Notice: Subject to any disclaimer, the term of this patent is extended or adjusted under 35 U.S.C. 154(b) by 36 days.

(21) Appl. No.: 13/044,010

(22) Filed: Mar. 9, 2011

(65) Prior Publication Data

US 2011/0162792 A1 Jul. 7, 2011

Related U.S. Application Data

(62) Division of application No. 11/921,261, filed as application No. PCT/JP2006/310724 on May 30, 2006, now abandoned.

(30) Foreign Application Priority Data

May 30, 2005 (JP) ................................. 2005-157368
Jul. 28, 2005 (JP) ................................. 2005-219698

(51) Int. Cl.
*B32B 37/06* (2006.01)

(52) U.S. Cl.
USPC ................. 264/29.7; 264/331.11; 264/331.12; 264/29.6

(58) Field of Classification Search
USPC .............. 264/29.1, 29.6, 29.7, 320, 404, 553, 264/571, 331.11–331.12
See application file for complete search history.

(56) References Cited

U.S. PATENT DOCUMENTS 3,766,000 A * 10/1973 Gibson et al. ................. 428/368
4,358,046 A * 11/1982 Detz et al. ..................... 228/176

(Continued)

FOREIGN PATENT DOCUMENTS

JP 61-275116 A 12/1986
JP 64-56364 A 3/1989

(Continued)

OTHER PUBLICATIONS

"Encyclopedia of Science," definition for coefficient of linear expansion from the internet, 2 pages, no date.

(Continued)

*Primary Examiner* — Joseph S Del Sole
*Assistant Examiner* — Nahida Sultana
(74) *Attorney, Agent, or Firm* — Birch, Stewart, Kolasch & Birch, LLP

(57) ABSTRACT

In order to obtain a graphite film having an excellent thermal diffusivity, a high density, and excellent flatness without flaws, recesses and wrinkles on the surface, the process for producing a graphite film according to the present invention comprises the graphitization step for a raw material film made of a polymer film and/or a carbonized polymer film and/or the post-planar pressurization step for the film in this order to prepare a graphite film, wherein the graphitization step is a step of thermally treating two or more stacked raw material films at a highest temperature of 2,000° C. and includes a method of electrically heating the raw material films themselves and/or a method of thermally treating the films while applying pressure to the films planarly, and the post-planar pressurization step includes a method of planarly pressurizing the one raw material film or the multiple stacked raw material films after graphitization by single-plate press or vacuum press.

27 Claims, 4 Drawing Sheets

30 μm

(56) References Cited

U.S. PATENT DOCUMENTS

| | | | |
|---|---|---|---|
| 4,808,475 A * | 2/1989 | Matsumura et al. | 428/367 |
| 4,842,665 A * | 6/1989 | Taguchi et al. | 156/155 |
| 4,876,077 A * | 10/1989 | Murakami | 423/448 |
| 4,915,984 A * | 4/1990 | Murakami | 427/113 |
| 4,923,648 A * | 5/1990 | Hara et al. | 264/29.2 |
| 4,983,244 A * | 1/1991 | Murakami et al. | 156/224 |
| 5,091,025 A | 2/1992 | Murakami et al. | |
| 5,449,507 A * | 9/1995 | Murakami et al. | 423/448 |
| 5,744,075 A * | 4/1998 | Klett et al. | 264/29.6 |
| 6,027,807 A | 2/2000 | Inoue et al. | |
| 8,187,400 B2 * | 5/2012 | Jeong et al. | 156/89.22 |
| 2002/0180091 A1 * | 12/2002 | Norley et al. | 264/105 |
| 2004/0131533 A1 * | 7/2004 | Spacie et al. | 423/448 |
| 2004/0227265 A1 * | 11/2004 | Nishida et al. | 264/29.1 |
| 2007/0013094 A1 * | 1/2007 | Bischofsberger et al. | 264/29.6 |
| 2008/0050305 A1 | 2/2008 | Nishikawa et al. | |
| 2011/0286810 A1 * | 11/2011 | Lancaster et al. | 408/145 |
| 2011/0318486 A1 * | 12/2011 | Liu et al. | 427/228 |
| 2012/0121880 A1 * | 5/2012 | Ohta et al. | 428/220 |

FOREIGN PATENT DOCUMENTS

| | | |
|---|---|---|
| JP | 3-075211 A | 3/1991 |
| JP | 5-78111 A | 3/1993 |
| JP | 8-267647 A | 10/1996 |
| JP | 2976481 B2 | 9/1999 |
| JP | 2000-169125 A | 6/2000 |
| JP | 2001-102056 A | 4/2001 |
| JP | 2004-123506 A | 4/2004 |
| JP | 2004-299937 A | 10/2004 |
| WO | 2005/123582 A1 | 12/2005 |

OTHER PUBLICATIONS

Akira Taomoto, "Netsu Dendosei ni Sugureta Junansei no aru Super Graphite Sheet," Function & materials, 1999 Nen, vol. 19, No. 11, pp. 27-33.

Y. Suhng et al., "The study of the graphitization behavior for polymide and polyamide films," Synthetic Metals, 1995 Nen, vol. 71, pp. 1751-1752.

Y. Suhng et al., "The study of the structural transformation for carbonized polymer films," Synthetic Metals, 1997 Nen, vol. 86, pp. 2285-2286.

* cited by examiner

PROCESS FOR PRODUCING GRAPHITE FILM AND GRAPHITE FILM PRODUCED THEREBY

This application is a Divisional of application Ser. No. 11/921,261, filed on Nov. 29, 2007, now abandoned for which priority is claimed under 35 U.S.C. §120, which is the national phase of PCT International Application No. PCT/JP2006/310724 filed on May 30, 2006 under 35 U.S.C. §371. The entire contents of each of the above-identified applications are hereby incorporated by reference.

TECHNICAL FIELD

The present invention relates to a process for producing a graphite film used as a heat radiation film, and a graphite film produced by the process.

BACKGROUND ART

Patent Document 1 describes, as a process for providing a graphite film having excellent electrical conductivity and thermal conductivity, "a process for producing a graphite film and fiber comprising graphitizing at least one polymer film or fiber selected from polyoxadiazole, polybenzothiazole, polybenzobisthiazole, polybenzoxazole, polybenzobisoxazole and polythiazole by thermally treating the polymer film or fiber at a temperature of 400 to 700° C. under vacuum or in an inert gas with tension applied thereto and then thermally treating the polymer film or fiber at a temperature of 1,600° C. or more under vacuum or in an inert gas", which is a so-called polymer pyrolysis process. Patent Document 2 also describes a so-called polymer pyrolysis process.

Patent Document 3 describes "a process for producing a graphite comprising thermally treating aromatic polyimide at a temperature of 2,200° C. or more and pressure bonding the resulting multiple carbonaceous films in a temperature region of 1,600° C. or more with a pressure of 4 kg/cm² or more applied to the films".
A process for producing a graphite comprising burning a kneaded product made of carbon raw material powder such as coke and a caking additive such as tar pitch and then electrically heating the burned product (Patent Document 4) is known as a process for producing a large quantity and volume of a graphite having inferior electrical conductivity and thermal conductivity but used for a bearing, seal, crucible, heating element or the like with high productivity.

Further, a process for producing a film-like graphite comprising thermally treating at a temperature of 2,400° C. or more a polymer film having a thickness enough to provide a graphite film by generation of gas from the film by heating at normal pressure; and rolling the resulting graphite film (Patent Document 2) is known as a process for producing an excellent film-like graphite having high flexibility and toughness.

Patent Document 1: Japanese Patent Laid-Open No. 61-275116
Patent Document 2: Japanese Patent No. 2976481
Patent Document 3: Japanese Patent Laid-Open No. 64-56364
Patent Document 4: Japanese Patent Laid-Open No. 5-78111

DISCLOSURE OF THE INVENTION

Problems to be Solved by the Invention

The present invention has been achieved in view of the above-described circumstances. An object of the present invention is to provide a graphite film that has an excellent thermal diffusivity, has a high density, and has excellent flatness without flaws, recesses and wrinkles on the surface.

Specifically, a graphite obtained by heating a polymer film atmospherically or under reduced pressure in the conventional art (Patent Documents 1 to 3) does not have sufficient thermal conductivity and is not sufficient as a heat radiation material for electronic equipment in recent years generating a drastically increased amount of heat.

This is presumably because, in the polymer pyrolysis process by atmospheric heating of the conventional art, a raw material film is heated from the surface and is non-uniformly graphitized between the inside and the surface of the film, and thus the film as a whole has reduced thermal conductivity.

A graphite may be thicker to increase the amount of heat transport in order to increase heat radiation properties. However, in the conventional polymer pyrolysis process, a film is easily broken, or only a graphite with low thermal conductivity can be obtained if the film is not broken. Specifically, in the conventional polymer pyrolysis process such as "a process for producing a film-like graphite comprising thermally treating at a temperature of 2,400° C. or more a polymer film having a thickness enough to provide a graphite film by generation of gas from the film by heating at normal pressure; and rolling the resulting graphite film" described in claim 1 of Patent Document 2, "a process for producing a film-like graphite comprising thermally treating a polymer film having a thickness of 75 um or less at a temperature of 2,400° C. or more; and rolling the resulting graphite film" described in claim 2 of Patent Document 2, or "a process for producing a film-like graphite comprising thermally treating a polymer film having a thickness of more than 75 um and 400 um or less at a temperature of 2,400° C. or more in a pressurized state", when a raw material film is thick, in particular, the film is graphitized from the surface in the middle of the graphitization step, making it difficult to release decomposition gas from the outside, and forced release of decomposition gas makes the film easily broken or only provides a graphite having low thermal conductivity if the film is not broken. The "pressurized state" in claim 3 of the aforementioned Patent Document 2 refers to, according to the description in the specification of Patent Document 2, a state where the atmosphere is pressurized from normal pressure to 0.2 kg/cm² or 1.0 kg/cm², for example, in "thermal treatment under isotropic pressurization conditions". According to the description, it is "not appropriate to use a method of applying pressure" to a raw material film anisotropically "only in the direction of a jig made of graphite or the like to hold the raw material film, such as hot press". The polymer pyrolysis process by heating under reduced pressure reduces thermal conductivity.

In particular, when the raw material film is thick, the film is graphitized from the surface, making it difficult to release decomposition gas from the inside, and the film is broken by forced release of decomposition gas. Even if the film is not broken, the film is not sufficiently internally graphitized unlike the case where the film is thin, and thermal conductivity is extremely inferior.

Further, it is possible to employ a process for producing a large number of graphite films comprising heating a plurality of stacked carbonaceous films atmospherically or under reduced pressure. However, in such a process, heat is non-uniformly transferred to the stacked films, and thus the stacked films are non-uniformly graphitized and may have inferior thermal conductivity. Wrinkles and cracks may be generated in the many treated films. The specification of Patent Document 2 describes that "it is not appropriate to use a method of applying pressure to a raw material film only in the direction of a jig made of graphite or the like to hold the raw material film, such as hot press; this is because free extension and shrinkage of the film itself are prevented and the generated gas breaks graphite crystallites." This means that it is not preferable to apply pressure in the thickness direction of the film during thermal treatment in the conventional art. The specification of Patent Document 2 describes that "the pressure applied must be isotropic", meaning that isotropic pressurization is preferable in the conventional art.

Further, as described in Example 1 of Patent Document 3, "a carbonaceous film obtained by thermal treatment at 2,000° C. or less could not be hot pressed due to the cracks generated in the film". This means that single-layer thermal diffusion films could not be produced by thermally treating a plurality of stacked carbonaceous films to which pressure was applied, because the carbonaceous films were pressure bonded or broken in the graphitization step. When the films were forcibly peeled off, the adhered parts were broken.

Patent Document 4 describes a graphitization method of burning a mixture made of carbon raw material powder and a caking additive and electrically heating the burned product. However, since such a burned product of a mixture containing a caking additive is used as a raw material in the conventional method, current flowing in the burned product is biased due to non-uniform conductivity of the burned product. Therefore, the temperature is locally increased, graphitization non-uniformly occurs, and the burned product has cracks and is easily broken. As a result, the graphite obtained by such a conventional electrical heating method has thermal conductivity and electrical conductivity extremely inferior to those of a graphite film obtained by thermally treating a polymer film by a conventional method. In particular, it is difficult to obtain a plurality of graphites at the same time with high quality in a stable manner, disadvantageously, because the position of the materials to be treated is deviated during heating. In order to prevent this disadvantage, there has been proposed a method of bonding the burned products with an adhesive and then electrically heating the products. However, in this method, graphites can be obtained without cracks but have extremely inferior thermal conductivity and electrical conductivity.

Patent Document 2 describes a method of further rolling a graphite film obtained by thermally treating a polymer film at a high temperature through two rollers made of ceramic or stainless steel. However, in this method, the graphite film to be rolled does not have sufficient strength. Therefore, when pressure is linearly applied to the part of the graphite film in contact with the rollers during rolling treatment, the graphite film is extended, the planarly formed graphite layer is broken, and thus thermal conductivity is reduced, disadvantageously. Moreover, the density varies among different parts or the density is reduced, so that thermal diffusivity varies, and thermal diffusivity is reduced because the film contains a large amount of an air layer, disadvantageously. Further, flaws or wrinkles are easily generated and recesses and longitudinal stripes are generated on the surface of the graphite film when the film is rolled through a roller having high strength such as a metal roller, disadvantageously. Such recesses and longitudinal stripes cause deterioration in contact of the graphite film with a heat generation component or heat radiation component, and thus are huge problems for applications making use of the excellent thermal diffusivity of the graphite.

Further, Patent Document 3 describes a process for producing an integral film-like graphite comprising pressure bonding a plurality of film-like graphites by hot press in a temperature region of 1,600° C. or more with a pressure of 4 kg/cm$^2$ or more applied to the graphites. However, it is difficult to recover film-like graphites obtained in this manner as separate multiple film-like graphites with no damage.

Means for Solving the Problems

The process for producing a graphite film according to the present invention comprises the step of graphitizing a raw material film made of a polymer film and/or a carbonized polymer film by retaining the film in and in contact with a container that can be directly electrified by application of voltage and electrifying the container by application of voltage. Electric resistance is reduced as graphitization proceeds. Accordingly, current flows in the whole film. As a result, the film is easily graphitized and uniformly heated due to contribution of heat generation of the raw material film itself by Joule heat. Thus, an excellent graphite film having excellent thermal conductivity can be obtained without breakage, cracks and wrinkles.

In particular, when a carbonaceous polymer film is used as the raw material film, even if the process comprises the step of graphitizing two or more such films stacked to which pressure is applied, a large number of graphite films having an excellent thermal diffusivity and excellent flatness can be obtained without breakage and adhesion.

The graphitization step preferably includes thermal treatment at a temperature of 2,000° C. or more. This can provide a graphite with excellent thermal conductivity.

The container that can be directly electrified by application of voltage is preferably a graphite container, because such a container is electrically heated to a temperature region of 2,500° C. and is easily handled and highly industrially available, for example.

The graphitization step is preferably carried out with carbon powder packed between the graphite container and the raw material film and/or on the outer periphery of the graphite container. The raw material film is more uniformly electrified and heated.

The graphitization step is preferably carried out with pressure applied to the raw material film planarly. Since carbon rearrangement is easily directed in the plane direction of the film in the graphitization process, an excellent graphite film having excellent flatness and high crystallinity can be obtained.

The pressure is preferably reduced in part of the graphitization step. This can prevent application of excessive pressure to the film, and a graphite film having excellent flatness and thermal conductivity can be obtained without breakage, adhesion, cracks and wrinkles.

The graphitization step is preferably carried out in the state where the two or more raw material films are stacked. Electric resistance is reduced as graphitization proceeds as described above. Accordingly, current flows in the whole stacked films. As a result, the stacked films are uniformly heated due to contribution of heat generation of the stacked raw material films themselves. Thus, graphite films can be obtained without breakage, cracks and wrinkles.

More preferably, the number of the stacked films is 10 in the state where the two or more raw material films are stacked.

The graphitization step is preferably carried out in the state where the two or more raw material films are stacked and a carbon material having a height smaller than the height of the stacked films is present around the stacked films. It is possible to apply planar pressure to the raw material films only corresponding to the height of the carbon material by a graphite jig used for holding the raw material films, for example. Thus, adhesion of the films to each other can be prevented.

The process preferably further comprises the post-planar pressurization step of pressurizing the graphitized raw material film planarly after the graphitization step. Since planar pressure is uniformly applied to the graphite film, the graphite layer is compressed without breakage and the thermal diffusivity is not reduced. Therefore, a graphite film can be obtained having a high thermal diffusivity, a high density, and excellent flatness without flaws, recesses and wrinkles on the surface. In particular, when the electrical heating method is used in the graphitization step, the graphite layer is planarly developed. Therefore, the post-planar pressurization step can provide a graphite film having a more excellent thermal diffusivity, a high density, and excellent flatness without flaws, recesses and wrinkles on the surface.

The pressurization is preferably carried out by single-plate press in the post-planar pressurization step. Since planar pressure can be uniformly applied to the graphite film, the graphite layer is compressed without breakage and the thermal diffusivity is not reduced. Therefore, a graphite film can be obtained having a high thermal diffusivity and a high density and having no flaws and wrinkles on the surface.

The pressurization is more preferably carried out by vacuum press in the post-planar pressurization step. Since the graphite film is pressurized under reduced pressure, the air layer contained in the graphite layer is compressed, the graphite layer is compressed without breakage, and the thermal diffusivity is not reduced. Therefore, a graphite film having a high thermal diffusivity and a high density can be obtained.

The graphitized raw material film is preferably pressurized together with a film-like medium other than the graphitized raw material film in the post-planar pressurization step.

The multiple graphitized raw material films are preferably simultaneously pressurized in the post-planar pressurization step. Since the graphite films themselves function as cushioning materials, graphite films can be obtained having more excellent flatness without flaws on the surface.

The process preferably further comprises the independent recovery step of recovering the multiple graphitized raw material films planarly pressurized as independent graphite films after the post-planar pressurization step. Graphite films can be obtained having a high diffusivity, a high density, and excellent flatness without flaws, recesses and wrinkles on the surface.

The carbonized polymer film is preferably obtained by the carbonization step of thermally treating a polymer film at a temperature of 600 to 1,800° C. Even the stacked graphitized raw material films are difficult to be adhered to each other during thermal treatment, and it is possible to prevent deviation of the position of the raw material films due to decomposition gas or deformation of the raw material films in the graphitization step. Thus, wrinkles and cracks of the resulting films can be prevented.

The polymer film is preferably made of one or more polymers selected from polyimide, polyamide, polyoxadiazole, polybenzothiazole, polybenzobisthiazole, polybenzoxazole, polybenzobisoxazole, poly(p-phenylene vinylene), polybenzimidazole, polybenzobisimidazole and polythiazole. This makes it possible to increase electrical conductivity and thermal conductivity of the final graphite film.

The polymer film is particularly preferably a polyimide film. Films having various structures and properties can be obtained by selecting a raw material monomer from various monomers.

The polyimide film preferably has a birefringence of 0.08 or more. Since the film is easily carbonized and graphitized, the resulting graphite film easily has increased electrical conductivity. More particularly preferably, the polyimide film has a birefringence of 0.12 or more.

The polyimide film is preferably prepared by imidizing a polyamide acid containing pyromellitic acid dianhydride and p-phenylenediamine using a dehydrating agent and an imidization promoter, because such a polyimide film has a high birefringence.

The polyimide film is particularly preferably prepared by synthesizing a prepolymer having an acid dianhydride at each terminal from a diamine and the acid dianhydride; synthesizing a polyamide acid by reaction of the prepolymer with a diamine differing from the diamine; and imidizing the polyamide acid, because the resulting polyimide film has a high birefringence and a low coefficient of linear expansion.

A graphite film produced by the process for producing a graphite film according to the present invention preferably has a coefficient of linear expansion of 0 ppm or less.

Such a graphite film of the present invention preferably has a tensile modulus of elasticity of 1 GPa or more.

Such a graphite film of the present invention preferably has a thermal conductivity in the contact thickness direction of 1.4 W/m·K or less measured by a thermal resistance measuring apparatus.

Such a graphite film of the present invention preferably has a tensile strength of 25 MPa or more.

Such a graphite film of the present invention preferably has a thermal diffusivity in the plane direction of $9.0 \times 10^{-4}$ m$^2$/s or more.

Such a graphite film of the present invention preferably has a density of 1.5 g/cm$^3$ or more.

Such a graphite film of the present invention preferably has a variation in thickness of 10 μm or less.

Such a graphite film of the present invention preferably has a cross-sectional structure having a part in which a surface layer and a layer other than the surface layer differ at least in cross-sectional pattern.

Effects of the Invention

The process for producing a graphite film according to the present invention comprises the step of graphitizing a raw material film made of a polymer film and/or a carbonized polymer film by retaining the film in and in contact with a container that can be directly electrified by application of voltage and electrifying the container by application of voltage. Electric resistance is reduced as graphitization proceeds. Accordingly, current flows in the whole film. As a result, the film is easily graphitized and uniformly heated due to contribution of heat generation of the raw material film itself by Joule heat. Thus, an excellent graphite film having excellent thermal conductivity can be obtained without breakage, cracks and wrinkles.

DESCRIPTION OF THE REFERENCE SIGNS

Figure 1:
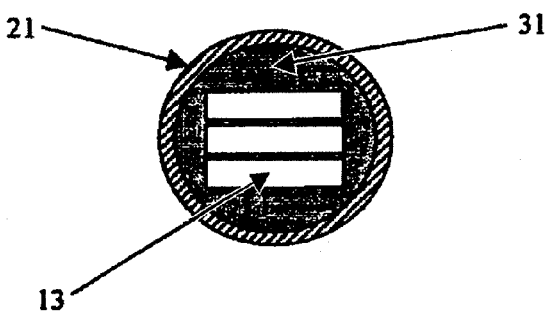
FIG. 1 shows a method of retaining a container A in a container B.

1 Polyimide film
2 Wedge-shaped sheet
3 Width of wedge-shaped sheet
4 Sodium light
5 Interference fringes
11 Smooth and electrifiable flat plate for contacting and retaining a raw material film
13 Container A contacting and retaining a raw material film
21 Cylindrical container B
31 Carbon particles packed between the container A and the container B
32 Carbon particles packed around the outer periphery of the container B
41 Graphite container for contacting and retaining a raw material film
42 Stacked raw material films
43 Graphite lid of the graphite container
44 Graphite screw for fixing the lid of the graphite container
45 Graphite bolt
46 Graphite nut
47 Smooth flat graphite plate

BEST MODES FOR CARRYING OUT THE INVENTION

<Raw Material Film>

The raw material film that can be used in the present invention is a polymer film or a carbonized polymer film.

<Polymer Film>

Examples of the material for the polymer film that can be used in the present invention include polyimide (PI), polyamide (PA), polyoxadiazole (POD), polybenzothiazole (PBT), polybenzobisthiazole (PBBT), polybenzoxazole (PBO), polybenzobisoxazole (PBBO), poly(p-phenylene vinylene) (PPV), polyphenylenebenzimidazole (PBI), polyphenylenebenzobisimidazole (PBBI) and polythiazole (PT). The material is preferably a heat-resistant aromatic polymer film including at least one of these polymers, because the final graphite has high electrical conductivity and thermal conductivity. The film can be produced by a known production process. Among these materials, polyimide is preferable, because films having various structures and properties can be obtained by selecting a raw material monomer from various monomers.

<Polyimide Film>

Since a polyimide film is more easily carbonized and graphitized than a raw material film having another organic material as a raw material, electrical conductivity of the film at low temperatures tends to be uniformly high and electrical conductivity itself also tends to be high. As a result, in the case of graphitizing the raw material film by retaining the film in a container that can be directly electrified by application of voltage, with the film brought into contact with the wall surface of the container, and electrifying the container by application of voltage, current uniformly flows in the film part as carbonization proceeds, and heat is uniformly generated on the surface and in the inside of the film. Therefore, a graphite having high thermal conductivity can be provided not only when the film is thin but also when the film is thick. Further, since the resulting graphite has excellent crystallinity and thermal resistance, the graphite is not broken even if locally heated by concentration of the electric field, and thus has high quality.

<Polyimide Film and Birefringence>

With regard to in-plane orientation of molecules, the polyimide film used in the present invention has a birefringence Δn in any in-plane direction of the film of 0.08 or more, preferably 0.10 or more, more preferably 0.12 or more, and most preferably 0.14 or more.

<Raw Material Film and Birefringence>

The film is more easily carbonized and graphitized as the film has a higher birefringence. Therefore, the film tends to have high electrical conductivity. As a result, in the step of graphitizing the raw material film by retaining the film in a container that can be directly electrified by application of voltage, with the film brought into contact with the wall surface of the container, and electrifying the container by application of voltage, current uniformly flows in the film as electric resistance is changed in accordance with the progression of carbonization. Further, as the film is carbonized, the amount of current flowing in the film is increased, and heat is uniformly generated on the surface and in the inside of the film. Therefore, the film is easily uniformly graphitized. Moreover, since electrical conductivity is uniformly increased in the plane of the film, partial electric field concentration does not occur and local heat generation does not occur in the film. As a result, the surface and the inside of the film are uniformly graphitized.

Since the film is carbonized and graphitized at low temperatures, the film has high electrical conductivity even in the middle of low-temperature thermal treatment. Heat is uniformly generated on the surface and in the inside of the film, and the film is easily uniformly graphitized.

Further, as the birefringence is higher, the graphite has more excellent crystallinity and thermal resistance. Therefore, the graphite is not broken even if locally heated by concentration of the electric field, and thus has high quality.

Even if the raw material is thick, a graphite having excellent thermal conductivity can be obtained, since the surface and the inside of the material are uniformly graphitized.

As the birefringence is higher, the resulting graphite film has thermal conductivity significantly improved. Accordingly, it is possible to reduce the highest treatment temperature for the raw material film resulting from heat generated by electrification, and thus power consumption can be reduced. Even thermal treatment in a short time can provide a graphite film with high quality.

It is not clear why the polyimide film is easily graphitized as the film has a high birefringence. Molecules need to be rearranged for graphitization, and molecular rearrangement can be minimized in a polyimide film that has a high birefringence and excellent molecular orientation. Therefore, it is assumed that when a polyimide film having more excellent orientation is treated at a relatively low highest treatment temperature due to heat generation by electrification treatment, a graphite film can be produced with higher crystallinity even if the graphite film is thick.

<Birefringence>

The birefringence herein refers to a difference between a refractive index in any in-plane direction of a film and a refractive index in the thickness direction of the film. The birefringence Δnx in any in-plane direction of a film is provided by the following formula 1.

[Formula 1]

Birefringence Δnx=(Refractive index in the in-plane X direction Nx)−(Refractive index in the thickness direction Nz)  (1)

Figure 2:
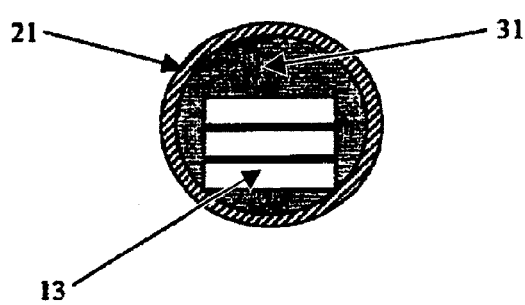
FIG. 2 shows a method of retaining a container A in a container B.

A specific method of measuring the birefringence is illustrated in FIGS. 1 and 2. In a plan view of FIG. 1, a thin wedge-shaped sheet 2 is cut off from a film 1 as a measurement sample. The wedge-shaped sheet 2 has a shape of an elongated trapezoid with one hypotenuse, and one basic angle of the sheet is a right angle. Here, the base of the trapezoid is cut off parallel to the X direction. FIG. 2 is an oblique view of the measurement sample 2 cut off in this manner. When the cut-off cross-section corresponding to the hypotenuse of the trapezoid sample 2 is irradiated with sodium light 4 at a right angle and the sample is observed using a polarization microscope from the cut-off cross-section corresponding to the hypotenuse of the trapezoid sample 2, interference fringes 5 are observed. The birefringence Δnx in the in-plane X direction of the film, in which n is the number of interference fringes, is represented by the following formula 2:

[Formula 2]

$$\Delta nx = n \times \lambda / d \quad (2)$$

wherein λ is a wavelength of a sodium D line of 589 nm, and d is a width 3 of the sample 2 corresponding to the height of the trapezoid of the sample.

The aforementioned term "any in-plane direction X of the film" refers to any of the 0° direction, 45° direction, 90° direction and 135° direction in the plane with reference to the direction of material flow when the film is formed, for example.

<Thermal Properties, Mechanical Properties, Physical Properties and Chemical Properties of Polyimide Film>

The polyimide film as a raw material for the graphite used in the present invention has an average coefficient of linear expansion of less than $2.5 \times 10^{-5}/°C$. at 100 to 200° C. When the coefficient of linear expansion is less than $2.5 \times 10^{-5}/°C$., the polyimide film is stretched only to a small extent and smoothly graphitized during thermal treatment, and a graphite not fragile with various excellent properties can be obtained. Conversion of such a polyimide film used as a raw material into the graphite starts at 2,400° C., and the polyimide film can be converted into a graphite having sufficient high crystallinity at 2,700° C. The coefficient of linear expansion is more preferably $2.0 \times 10^{-5}/°C$. or less.

The coefficient of linear expansion of the raw material film is determined using a TMA (thermomechanical analyzer) by first heating a sample to 350° C. at a heating rate of 10° C./min, then once cooling the sample with air to room temperature, again heating the sample to 350° C. at a heating rate of 10° C./min, and measuring the average coefficient of linear expansion at 100 to 200° C. at the second heating. Specifically, the coefficient of linear expansion is measured using a thermomechanical analyzer (TMA: SSC/5200H; TMA120C, manufactured by Seiko Instruments Inc.) in a nitrogen atmosphere by placing a film sample having a width of 3 mm and a length of 20 mm in a predetermined jig and applying a load of 3 g to the sample in a tensile mode.

The polyimide film used in the present invention preferably has a modulus of elasticity of 2.5 GPa or more, and more preferably 3.4 GPa or more, because such a film is more easily graphitized. Specifically, when the modulus of elasticity is 2.5 GPa or more, and more preferably 3.4 GPa or more, the film can be prevented from being broken by shrinkage of the film during thermal treatment, and a graphite having various excellent properties can be obtained.

The modulus of elasticity of the film can be measured in accordance with ASTM-D-882. The polyimide film has a modulus of elasticity of more preferably 3.0 GPa or more, still more preferably 4.0 GPa or more, and yet more preferably 5.0 GPa or more. When the film has a modulus of elasticity smaller than 2.5 GPa, the film is easily broken and deformed by shrinkage of the film during thermal treatment, and the resulting graphite tends to be inferior in crystallinity, density and thermal conductivity.

The water absorption of the film is measured as follows. The film is absolutely dried at 100° C. for 30 minutes to prepare a 25 μm-thick and 10 cm-square sample. The weight of the sample is measured as A1. The 25 μm-thick and 10 cm-square sample is dipped in distilled water at 23° C. for 24 hours, moisture on the surface is wiped and removed, and immediately the weight of the sample is measured. The weight of the sample is A2. The water absorption is determined by the following formula 3.

[Formula 3]

Water absorption (%)=(A2−A1)/A1×100  (3)

<Method for Preparing Polyimide Film>

The polyimide film used in the present invention can be produced by mixing an organic solution of polyamide acid as a polyimide precursor with an imidization promoter, then casting the mixture on a support such as an endless belt or stainless drum, and drying and firing the mixture into an imide.

The polyamide acid used in the present invention can be produced by a known method. Typically, substantially equimolar amounts of at least one aromatic acid dianhydride and at least one diamine are dissolved in an organic solvent. The resulting organic solution is stirred under controlled temperature conditions until polymerization of the acid dianhydride and the diamine is completed, so that the polyamide acid can be produced. Such a polyamide acid solution is obtained typically at a concentration of 5 to 35 wt %, and preferably at a concentration of 10 to 30 wt %. An appropriate molecular weight and an appropriate solution viscosity can be achieved when the solution concentration is within this range.

Any known method can be used as a polymerization method. For example, the following polymerization methods (1) to (5) are preferable.

(1) A method of dissolving an aromatic diamine in an organic polar solvent and reacting the diamine with an aromatic tetracarboxylic acid dianhydride in a molar amount substantially equal to that of the diamine to polymerize these components.

(2) A method of reacting an aromatic tetracarboxylic acid dianhydride with an aromatic diamine compound in a molar amount smaller than that of the dianhydride to obtain a prepolymer having an acid anhydride group at each terminal; and subsequently polymerizing the prepolymer using an aromatic diamine compound in a molar amount substantially equal to that of the aromatic tetracarboxylic acid dianhydride.

This method is the same as the method of synthesizing a prepolymer having an acid dianhydride at each terminal from a diamine and the acid dianhydride and synthesizing a polyamide acid by reaction of the prepolymer with a diamine differing from the diamine.

(3) A method of reacting an aromatic tetracarboxylic acid dianhydride with an aromatic diamine compound in a molar amount larger than that of the dianhydride to obtain a prepolymer having an amino group at each terminal; subsequently further adding an aromatic diamine compound to the prepolymer; and then polymerizing the components using an aromatic tetracarboxylic acid dianhydride in a molar amount substantially equal to the aromatic diamine compound.

(4) A method of dissolving and/or dispersing an aromatic tetracarboxylic acid dianhydride in an organic polar solvent; and then polymerizing the solution and/or dispersion using an aromatic diamine compound in a molar amount substantially equal to that of the acid dianhydride.

(5) A method of reacting a mixture of substantially equimolar amounts of an aromatic tetracarboxylic acid dianhydride and an aromatic diamine in an organic polar solvent to polymerize the mixture.

Among these, a method shown in (2) or (3) is preferable, in which polymerization is carried out by sequential control (sequence control) via a prepolymer (control of a combination of block polymers and a connection of block polymer molecules). This is because a polyimide film having a large birefringence and a small coefficient of linear expansion is easily obtained by using this method, and a graphite having high crystallinity and excellent density and thermal conductivity is easily obtained by thermally treating the polyimide film. It is assumed that the polyimide film is regularly controlled to have many overlapping aromatic rings and is easily graphitized even by thermal treatment at a low temperature. When the imide group content is made higher to increase the birefringence, the carbon ratio in the resin is reduced and the carbonization yield after graphite treatment is decreased. The polyimide film synthesized by sequential control is preferable, because the birefringence can be increased without reducing the carbon ratio in the resin.

<Acid Dianhydrides>

Acid dianhydrides that can be used for synthesis of polyimide in the present invention include pyromellitic acid dianhydride, 2,3,6,7-naphthalenetetracarboxylic acid dianhydride, 3,3',4,4'-biphenyltetracarboxylic acid dianhydride, 1,2,5,6-naphthalenetetracarboxylic acid dianhydride, 2,2',3,3'-biphenyltetracarboxylic acid dianhydride, 3,3',4,4'-benzophenonetetracarboxylic acid dianhydride, 2,2-bis(3,4-dicarboxyphenyl)propane dianhydride, 3,4,9,10-perylenetetracarboxylic acid dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, oxydiphthalic acid dianhydride, bis(3,4-dicarboxyphenyl)sulfone dianhydride, p-phenylenebis(trimellitic acid monoester acid anhydride), ethylenebis(trimellitic acid monoester acid anhydride), (bisphenol A)bis(trimellitic acid monoester acid anhydride) and their analogs. These may be used singly or in a mixture of two or more at any ratio.

<Diamines>

Diamines that can be used for synthesis of polyimide in the present invention include 4,4'-oxydianiline, p-phenylenediamine, 4,4'-diaminodiphenylpropane, 4,4'-diaminodiphenylmethane, benzidine, 3,3'-dichlorobenzidine, 4,4'-diaminodiphenyl sulfide, 3,3'-diaminodiphenyl sulfone, 4,4'-diaminodiphenyl sulfone, 4,4'-diaminodiphenyl ether (4,4'-oxydianiline), 3,3'-diaminodiphenyl ether (3,3'-oxydianiline), 3,4'-diaminodiphenyl ether (3,4'-oxydianiline), 1,5-diaminonaphthalene, 4,4'-diaminodiphenyldiethylsilane, 4,4'-diaminodiphenylsilane, 4,4'-diaminodiphenylethylphosphine oxide, 4,4'-diaminodiphenyl N-methylamine, 4,4'-diaminodiphenyl N-phenylamine, 1,4-diaminobenzene (p-phenylenediamine), 1,3-diaminobenzene, 1,2-diaminobenzene and their analogs. These may be used singly or in a mixture of two or more at any ratio.

In order to reduce the coefficient of linear expansion, increase the modulus of elasticity and increase the birefringence, it is preferable to use, as a raw material in particular, in production of a polyimide film in the present invention, an acid dianhydride represented by the following formula (1):

[Chemical Formula 1]

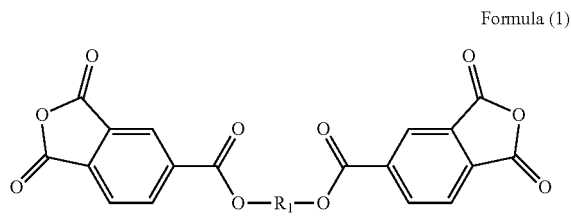

Formula (1)

wherein $R_1$ is any selected from divalent organic groups included in the following formulas (2) to (14):

[Chemical Formula 2]

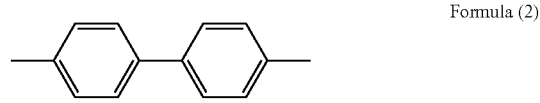

Formula (2)

Formula (3)

Formula (4)

Formula (5)

Formula (6)

Formula (7)

Formula (8)

Formula (9)

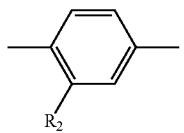
Formula (10)

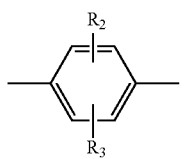
Formula (11)

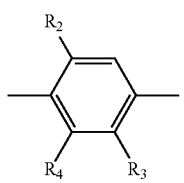
Formula (12)

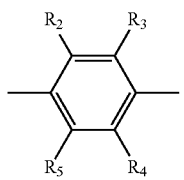
Formula (13)

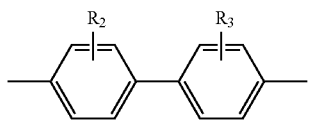
Formula (14)

wherein each of $R_2$, $R_3$, $R_4$, and $R_5$ may be any selected from the group of —$CH_3$, —Cl, —Br, —F or —$OCH_3$.

A polyimide film having a relatively low water absorption is obtained by using the above-described acid dianhydride. This is preferable because foaming by moisture can be prevented in the graphitization process.

In particular, an organic group including a benzene nucleus represented by the formulas (2) to (14) is preferably used as $R_1$ in the acid dianhydride, because the resulting polyimide film has high molecular orientation, a small coefficient of linear expansion, a high modulus of elasticity, a high birefringence and a low water absorption.

In order to further reduce the coefficient of linear expansion, further increase the modulus of elasticity, further increase the birefringence and further reduce the water absorption, an acid dianhydride represented by the following formula (15) may be used as a raw material in synthesis of polyimide in the present invention.

[Chemical Formula 3]

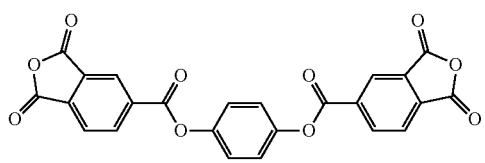
Formula (15)

In particular, a polyimide film obtained using, as a raw material, an acid dianhydride having a structure in which benzene rings are linearly bonded through two or more ester bonds contains a flexing chain but tends to have an extremely linear conformation in its entirety and is relatively rigid. As a result, the coefficient of linear expansion of the polyimide film can be reduced to, for example, $1.5 \times 10^{-5}/°$ C. or less by using this raw material. Further, the modulus of elasticity can be increased to 5.0 GPa or more and the water absorption can be reduced to 1.5% or less.

In order to further reduce the coefficient of linear expansion, further increase the modulus of elasticity and further increase the birefringence, polyimide in the present invention is preferably synthesized from p-phenylenediamine as a raw material.

The most appropriate diamines used for synthesis of polyimide in the present invention are 4,4'-oxydianiline and p-phenylenediamine. One or two of these diamines is preferably 40 mol % or more, more preferably 50 mol % or more, still more preferably 70 mol % or more, and yet more preferably 80 mol % or more in total based on the total diamines. Further, p-phenylenediamine is contained preferably at 10 mol % or more, more preferably 20 mol % or more, still more preferably 30 mol % or more, and yet more preferably 40 mol % or more. When the content of these diamines is less than the lower limit of the mol % ranges, the resulting polyimide film tends to have a high coefficient of linear expansion, a small modulus of elasticity and a small birefringence. However, when the total diamine content is the content of p-phenylenediamine, it is difficult to obtain a thick polyimide film in which only a small amount of foam is generated. Thus, it is preferable to use 4,4'-oxydianiline.

The most appropriate acid dianhydrides used for synthesis of a polyimide film in the present invention are pyromellitic acid dianhydride and/or p-phenylenebis(trimellitic acid monoester acid dianhydride) represented by the formula (15). One or two of these acid dianhydrides is preferably 40 mol % or more, more preferably 50 mol % or more, still more preferably 70 mol % or more, and yet more preferably 80 mol % or more in total based on the total acid dianhydrides. When the amount of these acid dianhydrides used is less than 40 mol %, the resulting polyimide film tends to have a high coefficient of linear expansion, a small modulus of elasticity and a small birefringence.

Additives such as carbon black and graphite may be added to a polyimide film, polyamide acid or polyimide resin.

Preferable solvents for synthesizing a polyamide acid include amide solvents such as N,N-dimethylformamide, N,N-dimethylacetamide and N-methyl-2-pyrrolidone. N,N-dimethylformamide and N,N-dimethylacetamide may be particularly preferably used.

Polyimide may be produced by a thermal cure method in which a polyamide acid as a precursor is converted into an imide by heating, or a chemical cure method in which a polyamide acid as a precursor is converted into an imide using a dehydrating agent represented by an acid anhydride such as acetic acid anhydride and an imidization promoter that is a tertiary amine such as picoline, quinoline, isoquinoline or pyridine. In particular, a high boiling imidization promoter such as isoquinoline is preferable. This is because the boiling imidization promoter is not evaporated at the initial stage of preparation of the film and easily exhibits the catalytic effect even in the last process of drying. The chemical cure method is more preferable, particularly because the resulting film has a small coefficient of linear expansion, a high modulus of elasticity and a high birefringence, can be rapidly graphitized at a relatively low temperature, and can provide a graphite with high quality. The dehydrating agent and the imidization promoter are particularly preferably used in combination, because the resulting film has a high coefficient of linear expansion, a high modulus of elasticity and a high birefringence. The chemical cure method is an industrially advantageous method with excellent productivity, in which imidization reaction more rapidly proceeds and thus the imidization reaction can be completed in a short time in heating treatment.

When the film is specifically produced using the chemical cure method, a stoichiometric amount or more of a dehydrating agent and an imidization promoter made of a catalyst are first added to a polyamide acid solution; the mixture is cast on or applied to a support such as a support plate, an organic film of PET or the like, a drum or an endless belt to form a film; and the organic solvent is evaporated to obtain a self-supporting film. Then, the self-supporting film is further heated to dry and imidize the film, thereby obtaining a polyimide film. The temperature in the heating is preferably 150° C. to 550° C. The heating rate in heating is not specifically limited. It is preferable that heating be gradually carried out continuously or stepwise so that the highest temperature is within the predetermined temperature range. The heating time varies according to the thickness of the film and the highest temperature, and is generally preferably 10 seconds to 10 minutes after reaching the highest temperature. Further, the step of producing a polyimide film preferably includes a step of fixing or stretching the film in order to prevent shrinkage, because the resulting film tends to have a small coefficient of linear expansion, a high modulus of elasticity and a high birefringence.

<Graphitization of Raw Material Film Including Polyimide Film>

In graphitization treatment, the raw material film is converted to a graphite structure after carbonization by thermal treatment. In this case, a carbon-carbon double bond must be cleaved and recombined. In order to make graphitization occur as easily as possible, it is necessary to make the cleavage and recombination occur at a minimum energy. Molecular orientation of the starting raw material film (for example, polymer films listed above, in particular, a polyimide film) affects arrangement of carbon atoms in the carbonized film, and the molecular orientation can reduce the energy for cleavage and recombination of the carbon-carbon double bond in graphitization. Accordingly, graphitization at a relatively low temperature can be carried out by designing molecules so that a high degree of molecular orientation easily occurs. The effect of the molecular orientation is more significant when the molecular orientation is a two-dimensional molecular orientation parallel to the film plane.

The second feature of graphitization reaction is that a thick raw material film is difficult to be graphitized at low temperatures. Accordingly, when the thick raw material film is graphitized, a graphite structure may not be formed in the inside of the film even if a graphite structure is formed in the surface layer. Molecular orientation of the raw material film promotes graphitization in the film and, as a result, the raw material film can be converted into an excellent graphite at a lower temperature.

The surface layer and the inside of the raw material film are graphitized almost at the same time, so that a graphite structure formed in the surface layer can be prevented from being broken by gas generated in the film and a thicker film can be graphitized. The raw material film prepared in the present invention (for example, polymer films listed above, in particular, a polyimide film) is assumed to have a molecular orientation most suitable for generating such an effect.

An aspect of the process for producing a graphite film according to the present invention is a process for producing a graphite film comprising at least the carbonization step of carbonizing a polymer film to produce a carbonized polymer film; and the graphitization step of graphitizing the carbonized polymer film to produce a graphite film.

<Carbonization Step>

The carbonized polymer film used as an example of the raw material film of the present invention is preferably obtained by preheating a polymer film as a starting material under reduced pressure or in an inert gas. The preheating is carried out typically at a temperature of about 1,000° C. For example, when the polymer film is heated at a rate of 10° C./min, the temperature of the film is preferably maintained in a temperature range of 1,000° C. for about 30 minutes. More specifically, the carbonization temperature for the polymer film is suitably 600° C. and more and less than 2,000° C.

Accordingly, the carbonized polymer film used as an example of the raw material film of the present invention is preferably obtained by thermally treating a polymer film at a temperature of 600° C. to 1,800° C. The thermal treatment temperature is 1,000° C. or more, more preferably 1,100° C. or more, still more preferably 1,200° C. or more, and particularly preferably 1,400° C. or more.

The carbonization temperature is preferably less than 2,000° C., because graphitization is carried out by electrical heating described later to obtain a graphite with excellent thermal conductivity, electrical conductivity and flatness. The carbonization temperature is preferably 600° C. or more, because the stacked graphitized raw material films are difficult to be adhered to each other during thermal treatment, and it is possible to prevent deviation of the position of the raw material films due to decomposition gas or deformation of the raw material films in the graphitization step. Thus, wrinkles and cracks of the resulting films can be prevented. In sum, the film is shrunk in the thickness direction and the plane direction in the carbonization step, and the film is shrunk in the thickness direction and expanded in the plane direction in the graphitization step. Therefore, when the raw material film is a polymer film, shrinkage of the film in the plane direction is suppressed by applying pressure in the thickness direction, and thus the film may have wrinkles or cracks. However, when the raw material film is a carbonized polymer film, expansion of the film in the plane direction is rather promoted by applying pressure in the thickness direction, and thus a graphite having excellent quality can be easily obtained. When the raw material film is a carbonized polymer film, the film is less deformed than a polymer film. Therefore, deviation in position of the film by deformation can be prevented and this is extremely preferable. In electrical heating, the raw material film and/or the graphite container are covered with carbon particles described later during thermal treatment. When a carbonized polymer film is used as the raw material film, the raw material film is dense and has high corrosion resistance, and thus the film is resistant to erosion and deterioration by the carbon particles, the graphite container, impurities such as metals intruding from the outside and gas from the outside during thermal treatment. Therefore, a large number of graphite films can be prepared having more excellent thermal conductivity, electrical conductivity and flexibility and having a small difference in quality in the plane (particularly between the film center and the film edges).

A carbonized polymer film is preferably used as the raw material film, because current flows both in the surface layer and in the inside of the film in the graphitization step by electrical heating, so that heat is simultaneously generated both in the surface layer and in the inside and the film is uniformly graphitized.

The temperature as described in the present specification can be measured using a radiation thermometer or the like in part of the outer wall or inside of a directly electrifiable container, for example. The term "thermal treatment" used in the present specification includes not only heating under reduced pressure and heating in a gas atmosphere in the conventional art, but also electrical heating which is a feature of the present invention and transfer itself of heat generated by electrification to the raw material film; that is, this term is used in a broad sense including multiple principles.

<Graphitization Step>

The graphitization step of the present invention may be carried out by once removing the polymer film carbonized by the carbonization step from a furnace for the carbonization step and transferring the film to a graphitization furnace. Alternatively, the carbonization step and the graphitization step may be continuously carried out in a single furnace.

<Graphitization Step Atmosphere>

The graphitization step is carried out under reduced pressure or in an inert gas. Argon or helium is appropriate for the inert gas.

<Graphitization Step Temperature>

In the process for producing a graphite film according to the present invention, the thermal treatment temperature must be at least 2,000° C. The final thermal treatment temperature is preferably 2,400° C. or more, more preferably 2,600° C. or more, and still more preferably 2,800° C. or more. Such a thermal treatment temperature can provide a graphite having excellent thermal conductivity. As the thermal treatment temperature is higher, the polymer film can be converted into a graphite with higher quality. From the economic point of view, it is preferable to convert the polymer film into a graphite with high quality at a temperature as low as possible. In order to realize an ultrahigh temperature of 2,500° C. or more, typically, current is directly caused to flow into a graphite heater and heating is carried out using Joule heat of the heater. The graphite heater is consumed at 2,700° C. or more. The consumption speed at 2,800° C. of the graphite heater is about 10 times that at 2,700° C., and the consumption speed at 2,900° C. of the graphite heater is about 10 times that at 2,800° C. Accordingly, it is considerably economically advantageous if the polymer film as a raw material is improved to reduce the temperature at which the polymer film can be converted into a graphite with high quality from 2,800° C. to 2,700° C., for example. The highest temperature at which thermal treatment can be carried out is 3,000° C. in an industrial furnace commonly available now.

<Electrical Heating>

In the graphitization step of the present invention, a raw material film made of a polymer film and/or a carbonized polymer film is preferably graphitized by an electrical heating method of retaining the film in and in contact with a container that can be directly electrified by application of voltage (direct electrification container) and electrifying the container by application of AC voltage and/or DC voltage. Since heat is generated by the container itself and thus the raw material film is electrically heated by application of voltage in this method, heat generation by the raw material film itself contributes to graphitization. In sum, when the graphitization step is carried out by the electrification method, the film is heated by two means: direct heat conduction from the heated container and self-heat generation of the film, so that the inside and the surface of the film are uniformly heated, and the film is also sufficiently uniformly heated from the periphery of the film, so that the surface and the inside of the film are uniformly graphitized. Therefore, a graphite film having excellent crystallinity and high quality can be obtained. Since the graphite layer is uniformly grown in the plane in the graphite film obtained through the graphitization step by the electrical heating method, the graphite film tends to be excellent in density and thermal diffusivity; is flat without flaws, wrinkles and recesses on the surface even after performing rolling treatment or pressurizing treatment; and has electrical conductivity and thermal conductivity more excellent than in a conventional graphite film. Such a method of retaining a raw material film in and in contact with a container that can be directly electrified by application of voltage may be, but is not necessarily limited to, a method of holding a raw material film with a metal plate or graphite plate and retaining the film in contact with the container wall or container bottom with no pressure particularly applied other than the self-weight of the metal plate or graphite plate, for example. A current of 10 mA or more flows in the raw material film, for example, as a result of electrification, depending on the size of the sample, based on electrical conductivity of the directly electrifiable container and the graphite film produced. In particular, even when the initial raw material film is transformed from an insulator to a conductor during the current flows, a graphite film with high quality can be produced in a stable manner by controlling the input electric power to prevent a drastic increase in temperature.

On the other hand, in conventional thermal treatment in a normal atmosphere and under reduced pressure, heating is carried out by heat conduction from atmospheric gas and/or radiation heat from a heater, or by heat conduction from a part in contact with a heater. Therefore, the film is non-uniformly heated by thermal conduction from the surface to the inside, basically. Thus, growth of the graphite layer tends to partially vary, and the film tends to be adversely affected by decomposition gas generated and partial defects tend to occur in crystal rearrangement during graphitization. In particular, when the raw material film is thick, the film is graphitized from the surface, making it difficult to release decomposition gas from the inside, and the film is broken by forced release of decomposition gas. Even if the film is not broken, the film is not sufficiently internally graphitized unlike the case where the film is thin, and only a graphite film having thermal conductivity extremely inferior can be obtained.

Further, in the process of the present invention, one surface and the other surface of a carbonized polymer film are brought into contact with a conductor (a container (which may be a graphite container) and/or carbon powder). Therefore, Joule heat generated by application of voltage is immediately transferred from both the one surface and the other surface of the film. Accordingly, even when a relatively thick raw material film having a thickness of about 125 μm or 225 μm, for example, is used, the inside, the surface and the periphery of the film are uniformly heated. Therefore, the surface and the inside are simultaneously graphitized, a graphite layer to prevent generation of decomposition gas is not formed in the surface layer, decomposition gas in the inside is easily released, and the film is not broken by decomposition gas. Thus, a thick graphite film having excellent electrical conductivity and thermal conductivity can be obtained.

Further, the raw material film is also preferably an insulator polymer film, because one surface and the other surface of the raw material film are brought into contact with a directly electrifiable container in the production process of the present invention, so that Joule heat generated by application of voltage is immediately transferred from both contacting parts and the film is carbonized.

Moreover, when the graphite film prepared by electrical heating is rolled or pressurized, a flat graphite film without flaws, wrinkles and recesses on the surface is easily obtained; however, when a conventional graphite film obtained by atmospheric heating or heating under reduced pressure is rolled or pressurized, the resulting graphite film is generally flat as a whole, but may have recesses with a depth of 1 mm or less visually observed and have flaws and wrinkles on the surface.

<Electrifiable Containers A and B>

Examples of the graphitization step by electrical heating of the present invention include a method of retaining a raw material film in a graphite container and electrifying the graphite container itself by application of voltage; a method of retaining a raw material film in a graphite container, covering the outer periphery of the graphite container with carbon powder (packing carbon powder in the outer periphery), and electrifying the graphite container itself by application of voltage through the carbon powder; a method of retaining a raw material film covered with carbon powder in a graphite container (retaining the raw material film with the carbon powder packed between the graphite container and the raw material film) and electrifying the graphite container itself by application of voltage; and a method of retaining a raw material film covered with carbon powder in a graphite container (retaining the raw material film with the carbon powder packed between the graphite container and the raw material film), covering the graphite container with carbon powder (with the carbon powder packed in the outer periphery of the graphite container), and electrifying the graphite container itself by application of voltage through the carbon powder. One aspect of the graphitization step preferably includes retaining one or more stacked raw material films in and in contact with a container A described later that can be directly electrified by application of voltage, retaining the container A in a similarly electrifiable container B, and graphitizing the films by electrifying the whole. Examples of the retention method used in this step include a retention method shown in any of FIGS. 1 to 3.

On the other hand, when the container A is not retained in the container B, specifically, when not two containers but one container is used to carry out the step of graphitizing a raw material film by direct electrification, it is preferable to retain the raw material film in and in contact with one directly electrifiable container, cover the outer periphery of each of such containers with carbon powder in contact with the outer periphery, and electrifying the whole to prepare a graphite film. In this case of electrifying many containers each covered with carbon powder to produce graphite films, quality of the produced graphite films may vary according to the packing density of the carbon powder or the difference in electric resistance between the containers themselves.

<Container Material>

Examples of the material for such containers A and B include tungsten, molybdenum and graphite. In an application in which electrical heating to a temperature range of 2,500° C. is carried out as in the present invention, graphite is particularly preferable taking easiness in handling, industrial availability and the like into consideration. Graphite herein includes, in a broad sense, a material containing graphite as a main component insofar as the material can be heated to the above temperature range. Graphite may be isotropic graphite or extruded graphite, for example. When allowing current to flow in or repeatedly using graphite, isotropic graphite having excellent electrical conductivity, thermal conductivity and uniformity is preferable.

In the process for producing a graphite film according to the present invention, a simple flat container or cylindrical container can be used. When a cylindrical container is used, the raw material film can be wound around and stored in the container. In the process for producing a graphite film according to the present invention, a rectangular parallelepiped container, a cubic container, a block-shaped container, a lunch box-shaped container with a lid, or the like is preferable, particularly because such a container can be easily prepared and is highly industrially available and the raw material film is preferably retained in contact with the container.

<Container Shape>

The container B preferably has a cylindrical shape. This is because voltage is biased during electrification more difficulty in a cylinder than in a rectangular tube, making it easy to electrically heat the whole container A uniformly.

The container A preferably has an angular shape such as a cubic or rectangular parallelepiped shape or a cylindrical shape taking industrial availability into consideration and preferably has a cylindrical shape with a lid taking operational convenience into consideration.

The containers A and B independently may or may not be used in a closed state. Each of the containers may be in a closed state with a cover. The inside of the container in a closed state may be pressurized to above normal pressure or depressurized to below normal pressure in accordance with the presence of gas expanded or shrunk as a result of heating or cooling. Each of the containers may not be in a closed state by allowing gas expanded or shrunk as a result of heating or cooling to enter or exit from the container through a space between the container and a cover (such as a lid), for example.

FIG. 1 shows a state where the outer periphery of the directly electrifiable container A is covered with carbon powder (carbon powder is present on the outer periphery of the container A) and the container A is retained not in contact with the container B.

In FIG. 2, the container A is retained in and in contact with the directly electrifiable container B in the above-described state (where carbon powder is present on the outer periphery of the container A).

Figure 3:
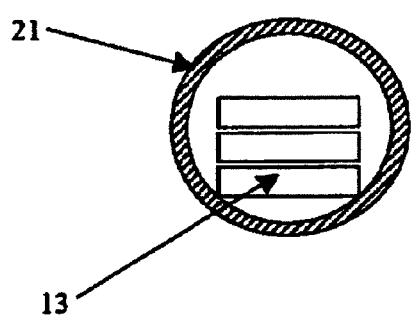
FIG. 3 shows a method of retaining a container A in a container B.

In FIG. 3, the directly electrifiable container A is retained in and in contact with the directly electrifiable container B. In FIG. 3, carbon powder is not used for retaining the container A in the container B. The carbon powder in this case is used for bringing the container B into electrical contact with the container A.

As described above, in the present invention, the graphitization step is carried out by retaining the container A in the container B, with one or more stacked raw material films retained in and in contact with the container A, so that voltage and heat can be uniformly applied to the container A. Therefore, there is no difference in quality of graphites prepared between the containers A. Further, since the density of the carbon powder on the outer periphery of the container A (packing density when packed) can be easily uniform, even if many containers A are retained in the container B, there is no difference in quality of graphites prepared between the containers A. That is, the graphite container and/or the raw material film can be uniformly electrified and heated by covering the container retaining the raw material film with carbon powder.

When the container A is retained in the container B and electrified by application of voltage, it is preferable not to bring the container A into contact with the container B. This is because, when the container A in contact with the container B is electrified by application of voltage, the container A is electrified only from the part of the container A in contact with the container B, and thus the container A is not uniformly electrically heated and the raw material may be insufficiently uniformly graphitized. Further, when the container A is retained in and in contact with the container B, with the outer periphery of the container A covered with carbon powder, the container A is electrified both through the part in contact with the container B and through the carbon powder covering the outer periphery of the container A. However, since electric resistance differs between the container B and the carbon powder, the container A is electrified primarily through the container B or the carbon powder having lower electric resistance, and thus the container A may be electrically heated insufficiently uniformly.

On the other hand, when the container A is retained in and not in contact with the container B, with the outer periphery of the container A covered with carbon powder (with the carbon powder present (preferably packed) on the outer periphery of the container A), the whole container A is uniformly electrified by application of voltage through the carbon powder present (preferably packed) on the outer periphery of the container A. Therefore, the container A can be uniformly electrically heated without partial voltage bias, and an excellent graphite film without variation in quality can be produced.

Due to the above-described reasons, the method shown in FIG. 1 is most preferable, the method shown in FIG. 2 is second most preferable, and the method shown in FIG. 3 is third most preferable for retaining the container A in the container B.

In addition to the retention state in any of FIGS. 1 to 3, a retention state is also preferable where the periphery of the raw material film is covered with carbon powder (the carbon powder is present (preferably packed) between the container A and the raw material film).

A retention state is also preferable where the outer periphery of the container B is covered with carbon powder (the carbon powder is present (preferably packed) on the outer periphery of the container B). Specifically, voltage is applied to carbon powder present on the outer periphery of the container B, with the outer periphery of the container B covered with the carbon powder (with the carbon powder present (preferably packed) on the outer periphery of the container B) as shown in FIG. 5, so that the container A and/or the raw material film are electrified through the carbon powder, the container B and the carbon powder between the container A and the container B.

Figure 4:
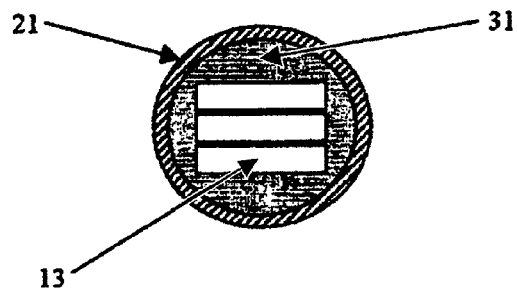
FIG. 4 shows a method of electrifying a container A and a container B.
Figure 5:
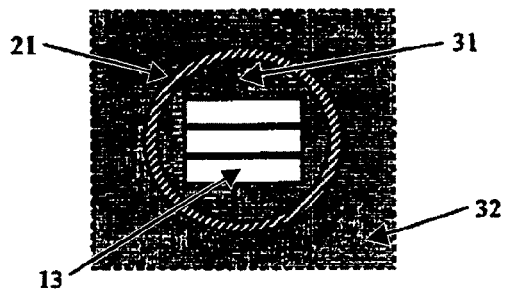
FIG. 5 shows a method of electrifying a container A and a container B.
Figure 6:
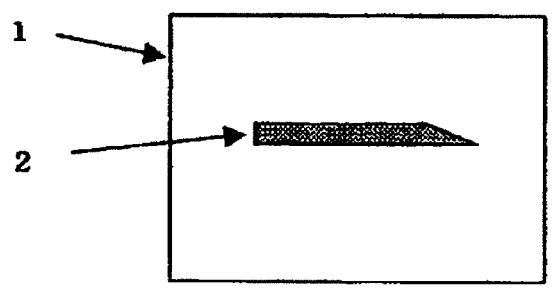
FIG. 6 shows a polyimide film and a wedge-shaped sheet.
Figure 7:
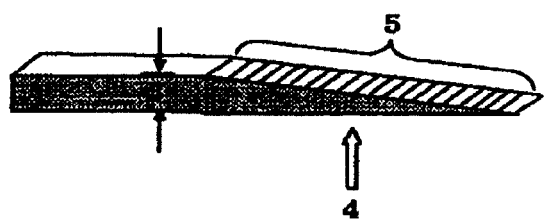
FIG. 7 is an oblique view of a wedge-shaped sheet.

On the other hand, voltage may be directly applied to the container B as shown in FIG. 4; however, the retention method shown in FIG. 5 is superior to this method in order to obtain an excellent graphite film having high thermal conductivity and no variation in properties. This is because the container B and/or the raw material film can be uniformly electrified and heated by covering the container with carbon powder.

As described above, the graphitization step by electrical heating is preferably carried out with the periphery of the raw material film covered with carbon powder, because the raw material film is uniformly electrified and heated.

<Carbon Powder>

The carbon powder used in the present invention is carbon powder heated to a temperature range of 2,500° C. (by electrification) as in the present invention. Examples of the carbon powder include carbon particles and graphite particles. That is, the carbon powder is herein used in a broad sense without specific limitations insofar as it refers to powder containing carbon as a main component. For example, the carbon powder may be prepared by thermally treating a substance, powder or fiber containing an organic substance as a main component and then crushing the product into powder or granulating the product. The thermal treatment temperature is 200° C. or more, more preferably 500° C. or more, and still more preferably 1,000° C. or more or 1,500° C. or more. It is also possible to use a substance containing carbon as a main component such as natural and/or artificial pitch, coke or carbon black. The carbon powder may be graphite particles. The graphite particles herein include, in a broad sense, a material containing graphite as a main component insofar as the material can be heated to the above temperature range. Examples of the graphite particles include crushed graphite cloth, crushed isotropic graphite, crushed extruded graphite, and carbon black. The powder shape, the particle size, the particle size distribution, and the like of the carbon powder are not specifically limited.

<Angle Formed by Electrification Direction and Normal Line of Raw Material Film>

In such electrification of the present invention, the angle formed by the electrification direction and the normal line of the raw material film surface is suitably more than 0° and less than 180°, preferably 60° and more and 120° or less, still more preferably 75° and more and 105° or less, and most preferably 90°. When the formed angle is 90°, the electrification direction is in the in-plane direction of the raw material film to make the raw material film uniformly electrified, and the electrification distance is long to promote heating of the raw material film itself. Therefore, a graphite film having excellent quality is easily obtained. On the other hand, when the angle formed by the electrification direction and the normal line of the raw material film surface is approximately 0°, that is, the electrification direction is the thickness direction of the raw material film, electrification may be prevented by resistance of the raw material film itself.

<Planar Pressurization>

In the graphitization step of the present invention, the raw material film is preferably graphitized with pressure applied to the raw material film planarly. Since carbon rearrangement is easily directed in the plane direction of the film in the graphitization process, a graphite film having high crystallinity can be obtained. Accordingly, a graphite film excellent in flatness and thermal diffusivity can be obtained.

Such a "planar pressurization" state can be realized by the self-weight of the stacked films; the self-weight of a jig used for holding the raw material film; the pressure received by the raw material film from a lid of a directly electrifiable container; the expansion of a directly electrifiable container around the raw material film by heating; and the pressure received by the raw material film by the expansion of a jig used for holding the film, for example.

On the other hand, when excessive pressure is applied to the raw material film in the graphitization step, free extension and shrinkage of the film itself are prevented, and free growth of graphite crystallites is prevented and rather the crystallites are broken, so that a graphite film having high quality may not be obtained. Therefore, the pressure is preferably reduced in part of the graphitization step in the "planar pressurization" state. For example, when two or more raw material films are stacked, cushioning properties are increased due to contact of the films with each other. Accordingly, even when excessive pressure is applied, breakage and partial adhesion of the films can be prevented to a certain extent. Furthermore, the pressure can be more strongly changed.

The initial pressure is preferably 0.0001 kg/cm$^2$ or more and less than 4 kg/cm$^2$. An initial pressure of 0.0001 kg/cm$^2$ or more promotes expansion of the film in the plane direction in graphitization during thermal treatment and can provide a graphite film with excellent thermal conductivity and flatness. An initial pressure of less than 4 kg/cm$^2$ can prevent the raw material film from being pressure bonded during thermal treatment and can provide a graphite film having excellent thermal conductivity and flatness without wrinkles and cracks.

In order to obtain an excellent graphite film, pressure is preferably planarly applied to the raw material film until thermal treatment for graphitization is completed. However, when excessive pressure is planarly applied to the raw material film, the graphite film is broken during thermal treatment. Therefore, in order to obtain a graphite film having excellent flatness without breakage, it is preferable that pressure planarly applied to the raw material film be reduced in part of the graphitization step and the pressure be applied until thermal treatment is completed.

The pressure can be reduced in part of the graphitization step by devising a container in contact with the raw material film and retaining the film. Here, a lunch box-shaped container with a lid will be described as a specific example of such a container; however, such a container is not limited to this example insofar as a container having the same effect in principle is used.

When the stacked raw material films are retained in contact with a lunch box-shaped container with a lid, the thickness of the raw material films is reduced as graphitization proceeds. On the other hand, the height of the lunch box-shaped container with a lid is not changed except for the deformed part due to thermal expansion. Therefore, the pressure between the container lid and the stacked films is reduced, pressure bonding of the raw material films can be prevented during thermal treatment, and graphite films having excellent thermal conductivity and flatness without wrinkles and cracks can be obtained.

<Stacking>

In the graphitization step of the present invention, the number of the raw material films treated at the same time may be one or may be two or more, and preferably 10 or more. The multiple raw material films are particularly preferably graphitized as stacked. Such a stacked state may be a state where the raw material films are simply stacked. There are no specific limitations to the stacking direction of the films (the stacking direction may be a direction in which the carbonized raw material films are stacked with every film deviated at 90°, for example) and the stacking method. The stacked raw material films do not have to have an equal area. The number of the stacked films is preferably 10 or more, more preferably 30 or more, and still more preferably 100 or more.

<Carbon Material>

The graphitization step of the present invention is preferably carried out in the stacked state with a carbon material having a height smaller than the height of the stacked raw material films present around the raw material films. This makes it possible to suppress application of excessive pressure to the raw material films planarly, where the pressure is reduced as the thickness of the raw material films is reduced due to graphitization of the raw material films in this step. Specifically, it is possible to apply planar pressure to the raw material films only corresponding to the height of the carbon material by a graphite jig used for holding the raw material films. Thus, adhesion of the films to each other can be prevented.

Such a carbon material is set to have a height H in the range of 0.2 to 0.9, more preferably in the range of 0.3 to 0.8, and still more preferably 0.4 to 0.7, which is calculated by the formula 4 as a ratio of a height of the carbon material to a stacking height of the raw material films. The height of the carbon material set in this manner is similar to the stacking height of the raw material films after graphitization, making it possible to suppress application of excessive pressure to the raw material films and maintain pressure to be applied to the raw material films until thermal treatment in the graphitization step is completed. This is because, when the raw material film used is a polymer film, the thickness of the resulting graphite film is often 40% to 60% of the thickness of the original polymer film, and when the raw material film used is a carbonized polymer film, the thickness of the resulting graphite film is often 50% to 70% of the thickness of the original carbonized polymer film. Such a carbon material may be a material described in the aforementioned section <Carbon powder>, and the shape of the carbon material is not particularly limited insofar as the material is present around the stacked raw material films.

[Formula 4]

$$H = (\text{Height of carbon material (mm)})/(\text{Stacking height of raw material films (mm)}) \quad (4)$$

<Electrification×Stacking>

In the graphitization method using electrical heating as described later, when multiple raw material films are used rather than a single raw material film, the resulting graphite films have more excellent thermal conductivity. This is presumably because the graphite film obtained by electrical heating has extremely high thermal conductivity and electrical conductivity, so that when stacked raw material films are retained in contact with an electrifiable container and graphitized by electrical heating, the percentage of the raw material films occupied in the container is increased as compared with the case where a single raw material film is used; the raw material films are more electrified than the container; and films having excellent thermal conductivity tend to be obtained. When the graphite films obtained by electrically heating multiple stacked raw material films rather than a single raw material film are rolled and compressed, extremely flexible graphite films can be obtained. This is primarily because graphite layers are developed in the plane direction, presumably. In electrical heating, the raw material film and/or the graphite container are covered with carbon particles described later during thermal treatment. When the stacked raw material films are thermally treated, the films are resistant to erosion and deterioration by the carbon particles, the graphite container, impurities such as metals intruding from the outside and gas from the outside during thermal treatment. Therefore, a large number of graphite films can be prepared having more excellent thermal conductivity, electrical conductivity and flexibility and having a small difference in quality in the plane (particularly between the film center and the film edges).

<Pressurization×Stacking>

In the graphitization with pressurization as described later, when multiple raw material films are used rather than a single raw material film, the resulting graphite films have more excellent thermal conductivity without breakage and wrinkles. This is presumably because the graphite film obtained by thermal treatment of a polymer film has extremely high thermal conductivity and electrical conductivity, so that when stacked and pressurized raw material films are graphitized, the percentage of the raw material films occupied in the container is increased as compared with the case where a single raw material film is used; the raw material films are more electrified than the container; and films having excellent thermal conductivity tend to be obtained. When the raw material film is brought into contact with, retained in and fixed to the graphite container, the film is thermally treated with the film held by a graphite plate from up and down. When a single raw material film is used, the film is brought into contact with the graphite plate. However, when multiple raw material films are used, the raw material films each thinner than the graphite plate are brought into contact with each other and have followability to the raw material films higher than to the graphite plate, so that graphite films having a small number of wrinkles and cracks are easily obtained.

<Electrification×Pressurization>

When graphitization is carried out using electrical heating and pressurization in combination, a graphite film having excellent flatness without wrinkles and cracks can be obtained even by thermally treating a single film held by a plate having inferior followability such as a graphite plate. Even when the stacked raw material films are treated, mutual adhesion of the raw material films can be prevented unlike a case where the films are only pressurized, and graphite films having excellent thermal conductivity can be obtained. This is presumably because graphitization is further promoted using electrical heating and pressurization in combination.

<Carbonization×Stacking×Electrification>

When voltage is applied to a container with one or more carbonized polymer films stacked, current flows in the films according to the change in electric resistance corresponding to the progression of carbonization, because the films are already carbonized. Further, as graphitization proceeds, resistance is lower and thus an increased amount of current flows in the films. Accordingly, heat is generated in the whole stacked films themselves. In particular, since current flows in both the surface layer and the inside of each of the stacked films, heat generation simultaneously proceeds in both the surface layer and the inside. As a result, the films are uniformly graphitized.

Further, current flows according to the change in electric resistance corresponding to the progression of carbonization. As graphitization proceeds, resistance is lower and the amount of current flowing in the films is increased. Thus, the amount of heat generation in the films is increased and the films are easily graphitized. In particular, even if the amount of heat generation is partially increased, thermal conductivity is increased as the films themselves generate heat and are graphitized. Therefore, heat is transferred to the whole stacked films and each of the stacked films is uniformly heated.

A carbonized polymer film before graphitized tends to have thermal conductivity inferior to that of a graphite. Therefore, since thermal conduction is only one heating means in conventional atmospheric thermal treatment or thermal treatment under reduced pressure, it is difficult for heat to be sufficiently transferred to the inside of the stacked films; the graphitization state tends to differ between the surface layer and the inside; and only the upper and lower films among the stacked films tend to be graphitized and an insufficiently graphitized part tends to remain in the middle films among the stacked films. As a result, when the multiple stacked films are thermally treated at high temperatures in the conventional method, the insufficiently graphitized part in the films is expanded and burst and the films are completely broken.

On the other hand, in the process of the present invention, the container itself that can be directly electrified by application of voltage is heated by application of voltage, and at the same time current flows in the carbonized part of the carbonized polymer film according to the change of electric resistance corresponding to progression of carbonization or graphitization, and the film itself generates heat. Accordingly, heat can be sufficiently supplied to the film by two means: direct heat transfer from a heated container and self-heat generation of the film, so that heat can be sufficiently supplied even to the middle films among the stacked films; and not only are the upper and lower films among the stacked films graphitized but all the stacked films are simultaneously graphitized.

Moreover, since electrical conductivity is uniformly increased in the plane of each of the stacked films, partial electric field concentration does not occur in the film and local heat generation does not occur. As a result, the surface and the inside of the film are uniformly graphitized. Further, since the graphite after thermal treatment has extremely excellent crystallinity and excellent thermal resistance, the graphite is not broken even if locally heated by concentration of the electric field, and thus has high quality.

As described above, in the present invention, a conductor is even brought into contact with the surface of each end film of one or more stacked carbonized polymer films. Accordingly, when the films are electrically heated by application of voltage, carbonization first proceeds from both surfaces of the films; current subsequently flows in the inside of the films according to the change in electric resistance corresponding to progression of carbonization in the inside of the films; the amount of current flowing in the films is increased as carbonization proceeds; and finally the stacked films are uniformly heated. For this reason, the films are easily uniformly graphitized. Moreover, since electrical conductivity is uniformly increased in the plane of each of the stacked films, partial electric field concentration does not occur in the film and local heat generation does not occur. As a result, the surface and the inside of the film are uniformly graphitized. Further, since the graphite after thermal treatment has extremely excellent crystallinity and excellent thermal resistance, the graphite is not broken even if locally heated by concentration of the electric field, and thus has high quality.

<Post-Planar Pressurization Step>

The process for producing a graphite film according to the present invention preferably comprises the "post-planar pressurization step" of further planarly pressurizing a raw material film graphitized through the graphitization step, that is, a graphite film. A graphite film can be obtained having a high diffusivity, a high density, and excellent flatness without flaws, recesses and wrinkles on the surface. Such a "post-planar pressurization step" may be carried out at room temperature.

In such a "post-planar pressurization step", the graphite film is preferably planarly pressurized together with a film-like medium other than the graphite film.

It is preferable to planarly pressurize the multiple graphite films placed as stacked. Since the graphite films themselves function as cushioning materials, graphite films can be obtained with excellent flatness without flaws on the surface.

Such "post-planar pressurization" can be carried out by single-plate press, vacuum press or the like. Vacuum press is particularly preferable, because uniform planar pressurization is performed, and vacuuming is performed to make it possible to compress the air layer contained in the graphite film.

More specifically, the post-planar pressurization may be carried out by a method of pressurizing the graphite film using a planarly pressurizable apparatus such as a pressing machine, a hot pressing machine or a single-plate pressing machine; or a method of holding the graphite film with a plastic plate, a ceramic plate or a metal plate and bolting the film, for example. When such a method is used, pressure can be uniformly planarly applied, the graphite layer is compressed without breakage, and the thermal diffusivity is not reduced. Thus, a graphite film can be obtained having a high thermal diffusivity and a high density and having no flaws and wrinkles on the surface. The film is preferably heated during pressurization to more uniformly pressurize the film.

Examples of the vacuum press method include a method of pressurizing the film using a vacuum pressing machine such as a pressing machine, a hot pressing machine or a single-plate pressing machine provided with a vacuuming function; a method of holding the graphite film by a plastic plate, a ceramic plate or a metal plate, bolting the film, and then vacuuming the whole; and a method of uniformly pressurizing the graphite film such as vacuum rubber press in which the graphite film is held by rubber and pressure of the inside is reduced by vacuuming. In such a method, pressure can be uniformly planarly applied, the air layer contained in the graphite film is compressed due to vacuuming, the graphite layer is compressed without breakage, and the thermal diffusivity is not reduced. Thus, a graphite film can be obtained having a high thermal diffusivity and a high density and having no flaws and wrinkles on the surface. In performing vacuum press, vacuuming is preferably carried out before pressurization. The film may have wrinkles when first pressurized; however, the graphite film is uniformly pressurized as a whole when first depressurized, so that a graphite film having excellent quality without wrinkles can be obtained. Also in this method, the film is preferably heated during pressurization to more uniformly pressurize the film. Such a graphite film is preferable, because the film has excellent thermal conductivity and thus heat is uniformly transferred to the film, and a flat graphite film having uniformity in the plane can be obtained.

<Film-Like Medium>

Examples of the film-like medium other than the graphite film include a graphite film obtained from natural graphite, a resin film and metal foil. Specific examples include a graphite film obtained from natural graphite, a shock-absorbing rubber material, an iron plate and a Teflon™ film.

The term "together with a film-like medium" refers to the following cases, for example: a case where films are sandwiched in the following manner: (a medium other than the graphite film/the one graphite film/a medium other than the graphite film/the one graphite film/a medium other than the graphite film/ . . . ), for example; and a case where films are sandwiched in the following manner: (a medium other than the graphite film/the multiple graphite films/a medium other than the graphite film/the multiple graphite films/a medium other than the graphite film/ . . . ), for example.

<Independent Recovery Step>

The process for producing a graphite film according to the present invention preferably comprises the independent recovery step of recovering the multiple graphite films after the post-planar pressurization step as graphite films independent from each other. Specifically, the independent recovery step may be carried out by a method of inserting a flat tip of a pincette into the interface between the graphite films; or a method of gripping the edges of the two or more film-like media, respectively, and shifting the media parallel to the plane direction of the graphite films, for example. As described above, the present invention mainly aims to prepare graphite films independent from each other and does not aim to pressure bond two or more graphite films.

<Thickness, Density and Shape of Graphite Film>

The graphite film of the present invention may specifically have a thickness of 20 μm or more, preferably 50 μm or more, and more preferably 90 μm or more. When the thickness is 90 μm or more, the amount of heat transfer is increased, and thus heat easily escapes from heat generating equipment and an increase in temperature can be suppressed. The graphite film of the present invention specifically has a density of 1.2 g/cm$^3$ or more, preferably 1.5 g/cm$^3$ or more, and more preferably 1.8 g/cm$^3$. In this manner, the air layer contained in a space between layers of the graphite film is reduced and the graphite film has a uniformly high density. Therefore, a variation in thermal diffusivity is reduced, and a graphite film having excellent thermal diffusivity is obtained. Such a graphite film of the present invention does not have recesses, flaws, longitudinal stripes and wrinkles on the surface. Therefore, contact of the film with a heat generation component or heat radiation component is improved, and the film can have excellent thermal diffusivity as a graphite.

<Thermal Diffusivity of Graphite Film>

The graphite film of the present invention may have a thermal diffusivity of $5.0 \times 10^{-4}$ m$^2$/sec or more, preferably $8.0 \times 10^{-4}$ m$^2$/sec, and more preferably $9.0 \times 10^{-4}$ m$^2$/S. When the thermal diffusivity is $5.0 \times 10^{-4}$ m$^2$/sec or more, thermal conductivity is high, and thus heat easily escapes from heat generating equipment and an increase in temperature of the heat generating equipment can be suppressed.

Such a thermal diffusivity is an index of progression of graphitization. For example, as the film has a higher thermal diffusivity in the plane direction, graphitization is more significant. The thermal diffusivity can be measured by a thermal diffusivity meter according to an AC method ("LaserPit" available from ULVAC-RIKO, Inc.) in an atmosphere at 20° C. at 10 Hz.

<Applications>

The graphite film of the present invention has high thermal conductivity and electrical conductivity, and is therefore suitable as a heat radiation material, a heat radiation component, a cooling component, a temperature control component or an electromagnetic shielding component for electronics such as servers, personal computer servers and desktop personal computers; portable electronics such as notebook personal computers, electronic dictionaries, PDAs, mobile telephones and personal music players; displays such as liquid crystal displays, plasma displays, LEDs, organic EL displays, inorganic EL displays, liquid crystal projectors and watches; image-forming devices such as ink jet printers and electro-photographic devices (developing devices, fixing devices, heat rollers and heat belts); semiconductor-related components such as semiconductor elements, semiconductor packages, semiconductor sealing cases, semiconductor die bonding, CPUs, memories, power transistors and power transistor cases; wiring boards (including printed wiring boards) such as rigid wiring boards, flexible wiring boards, ceramic wiring boards, build-up wiring boards and multilayer substrates; production equipment such as vacuum treatment equipment, semiconductor production equipment and display production equipment; heat-insulating devices such as heat-insulating materials, vacuum heat-insulating materials and radiation heat-insulating materials; data recording devices such as DVDs (optical pickups, laser generators and laser receivers) and hard disk drives; image-recording devices such as cameras, video cameras, digital cameras, digital video cameras, microscopes and CCDs; and battery devices such as charging devices, lithium ion batteries and fuel cells, for example.

<Forms of Use>

When the graphite film of the present invention is actually used for a heating element, a heat sink, a heat pipe, a water cooler, a Peltier element, an enclosure, a hinge and the like, the film preferably has an adhesive layer, a resin layer, a ceramic layer, a metal layer, an insulating layer, a conductive layer and the like formed on one surface and/or both surfaces in order to improve fixability of the film to them, thermal diffusivity, heat radiation properties and handleability.

The reason why and the mechanism in which a graphite film obtained by the process for producing a graphite film according to the present invention is superior in uniformity to a graphite film by a conventional production process can be presumed as described above, although it is necessary to further perform detailed academic research on the reason and mechanism.

Various examples of the present invention will be described together with some comparative examples. However, the present invention is not limited to the examples.

EXAMPLES

Preparation of Polyimide Film A

One equivalent of pyromellitic acid dianhydride was dissolved in a solution of 1 equivalent of 4,4-oxydianiline in DMF (dimethylformamide) to obtain a polyamide acid solution (18.5 wt %).

While cooling this solution, 1 equivalent of acetic acid anhydride, 1 equivalent of isoquinoline and an imidization catalyst containing DMF were added for a carboxylic acid group contained in polyamide acid to carry out defoaming. Next, the mixed solution was applied to an aluminum foil at a predetermined thickness after drying. Further, the mixed solution layer on the aluminum foil was dried using a hot air oven and a far infrared heater.

The following drying method was used in preparing a film having a final thickness of 75 μm or less, for example. The mixed solution layer on the aluminum foil was heated and dried in a hot air oven at 120° C. for 240 seconds to once obtain a self-supporting gel film. Then, the gel film was separated from the aluminum foil and fixed to a frame. Further, the gel film fixed in the frame was heated stepwise in a hot air oven at 120° C. for 30 seconds, at 275° C. for 40 seconds, at 400° C. for 43 seconds and at 450° C. for 50 seconds and in a far infrared heater at 460° C. for 23 seconds.

A polyimide film having a thickness of 75 μm and 125 μm (polyimide film A: modulus of elasticity 3.1 GPa, water absorption 2.5%, birefringence 0.10, coefficient of linear expansion $3.0 \times 10^{-5}/°$ C.) was prepared in the above manner. When preparing a film having another thickness, the firing time was controlled in proportion with the thickness. When preparing a thick film, it is necessary to ensure a sufficient firing time at a low temperature in order to prevent foaming due to evaporation of the solvent or imidization catalyst from the polyimide film.

In actual graphitization, a polyimide film of Apical AH manufactured by Kaneka Corporation having a thickness of 75 μm and 125 μm was used which was prepared by the same method as above.

Method for Preparing Polyimide Film B

Four equivalents of pyromellitic acid dianhydride was dissolved in a solution of three equivalents of 4,4'-oxydianiline in DMF to synthesize a prepolymer having an acid anhydride at each terminal. A solution containing the prepolymer was also obtained. Thereafter, 1 equivalent of p-phenylenediamine was dissolved in the solution containing the prepolymer to obtain a polyamide acid solution.

A polyimide film having a thickness of 75 μm (polyimide film B: modulus of elasticity 4.1 GPa, water absorption 2.1%, birefringence 0.14, coefficient of linear expansion $1.6 \times 10^{-5}/°$ C.) was prepared in the same manner as in the above <Preparation of polyimide film A> except for using this polyamide acid solution.

In actual graphitization, a polyimide film of Apical NPI manufactured by Kaneka Corporation having a thickness of 75 μm was used which was prepared by the same method as above.

(Preparation of Carbonized Polymer Film)

The polyimide film A or B held in a graphite plate was placed in an electric furnace, heated to 1,000° C. in a nitrogen atmosphere, and carbonized by thermal treatment in this state for one hour to obtain a carbonized polymer film. In this manner, a carbonized polymer film A' was obtained from the polyimide film A having a thickness of 75 μm, a carbonized polymer film A" was obtained from the polyimide film A having a thickness of 125 μm, and a carbonized polymer film B' was obtained from the polyimide film B having a thickness of 75 μm.

The polyimide film A held in a graphite plate was placed in an electric furnace, heated to 1,400° C. in a nitrogen atmosphere, and carbonized by thermal treatment in this state for one hour to obtain a carbonized polymer film. In this manner, a carbonized polymer film A''' was obtained from the polyimide film A having a thickness of 75 μm.

(Preparation of Graphite Film A)

The carbonized polymer film A' was placed in a ultrahigh temperature furnace, heated to 2,800° C. in an argon atmosphere, maintained in this state for one hour, and then cooled to obtain a graphite film A.

(Preparation Method of Graphite Film A')

The carbonized polymer film A' was retained in a graphite container, covered with carbon powder containing coke as a main component, and then further retained in an electrifiable graphite container and covered with carbon powder. Thereafter, the film was heated to 3,000° C. not by atmospheric heating but by electrification of the container and carbon powder as a whole by application of direct voltage to prepare a graphite film N.

(Preparation of Graphite Film B')

The carbonized polymer film B' was retained in a graphite container, covered with carbon powder containing coke as a main component, and then further retained in an electrifiable graphite container and covered with carbon powder. Thereafter, the film was heated to 3,000° C. not by atmospheric heating but by electrification of the container and carbon powder as a whole by application of direct voltage to prepare a graphite film B'.

Comparative Example 1

Figure 8:
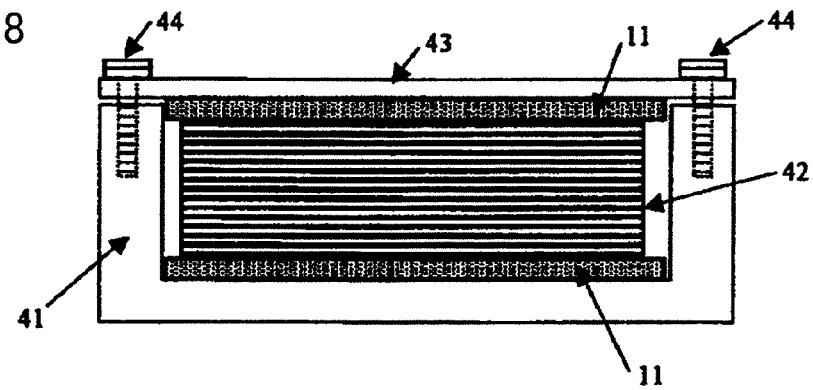
FIG. 8 shows a graphite container used for contacting and retaining a raw material film. The pressure planarly applied to the raw material film is reduced in part of the graphitization step.

The ten stacked carbonized polymer films A' (length 200 mm×width 200 mm) were held by upper and lower flat graphite plates having a length of 270 mm, a width of 270 mm and a thickness of 3 mm and retained in and in contact with a rectangular parallelepiped graphite container shown in FIG. 8. The stacked carbonized polymer films A' were atmospherically heated to 3,000° C. with a graphite heater in an argon atmosphere under reduced pressure at 0.09 MPa, with pressure planarly applied to the films A', and the films were maintained in this state for one hour. Then, the films were cooled to obtain graphite films. In this Example 1, the ten carbonized polymer films A' as raw material films were retained in the graphite container of FIG. 8, so that pressure planarly applied to the stacked carbonized polymer films A' in the graphitization step was automatically reduced.

Example 1

The one carbonized polymer film A' was held by the upper and lower flat graphite plates and retained in and in contact with a rectangular parallelepiped graphite container shown in FIG. 8, so that pressure was planarly applied to the carbonized polymer film A'. The graphite container was covered with carbon powder containing coke as a main component, and the container and carbon powder as a whole were electrically heated to 3,000° C. by application of direct voltage to prepare a graphite film. In Example 2, a graphite container of FIG. 8 was used for retaining the raw material film. Thus, pressure planarly applied to the carbonized polymer film A' was reduced in part of the graphitization step.

Example 2

Graphite films were prepared in the same manner as in Example 1, except that the ten carbonized polymer films A' were stacked.

Example 3

Graphite films were prepared in the same manner as in Example 1, except that the thirty carbonized polymer films A' were stacked.

Example 4

Graphite films were prepared in the same manner as in Example 1, except that the one hundred carbonized polymer films A' were stacked.

Example 5

Figure 9:
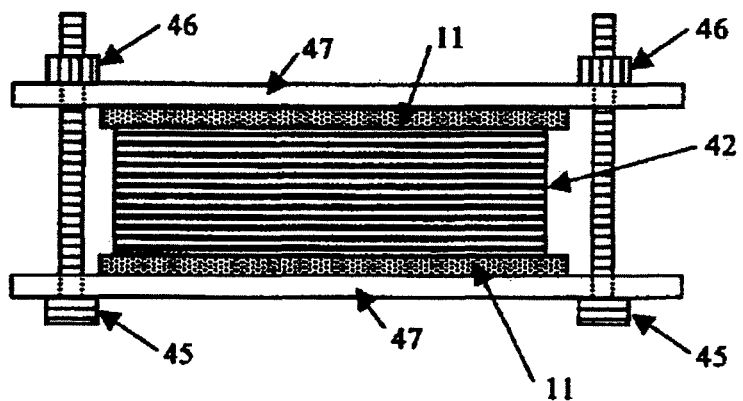
FIG. 9 shows a graphite jig used for contacting and retaining a raw material film. The pressure planarly applied to the raw material film is not reduced in the graphitization step.

The ten carbonized polymer films A' were stacked, held by a graphite jig shown in FIG. 9, retained in and in contact with a graphite container of FIG. 2 in this state, and electrified in the same manner as in Example 1 to prepare graphite films. Since the stacked films were held by the graphite film as shown in FIG. 9, pressure planarly applied to the films was not reduced in the graphitization step.

Example 6

Graphite films were prepared in the same manner as in Example 1, except that the ten carbonized polymer films A' were stacked and retained in and in contact with a graphite container with pressure not anisotropically applied to the stacked carbonized polymer films A'.

Example 7

Graphite films were prepared in the same manner as in Example 1, except that the ten carbonized polymer films A'' were stacked.

Example 8

Graphite films were prepared in the same manner as in Example 1, except that the thirty carbonized polymer films A''' were stacked.

Example 9

Graphite films were prepared in the same manner as in Example 1, except that the thirty carbonized polymer films A' were stacked and a carbon material having a height with a parameter H of 0.6 with respect to the stacking thickness of the stacked carbonized polymer films A' was present around the raw material films.

Example 10

Graphite films were prepared in the same manner as in Example 1, except that the ten carbonized polymer films B' were stacked.

Example 11

A graphite film was prepared in the same manner as in Example 1, except that the one polymer film A was used as a raw material film.

Comparative Example 2

The one carbonized polymer film A' was retained in a graphite container with pressure not anisotropically applied to the film, heated to 3,000° C. in an argon atmosphere under reduced pressure at 0.09 MPa using a ultrahigh temperature furnace with a graphite heater, and maintained at that highest temperature for one hour. Thereafter, the film was cooled to obtain a graphite film. The graphite film obtained in this manner had wrinkles and inferior flatness.

Comparative Example 3

The one carbonized polymer film A' was held by a graphite jig shown in FIG. 9, retained in a graphite container of FIG. 2 with pressure planarly applied to the carbonized polymer film not reduced in the graphitization step, and atmospherically heated in the same manner as in Comparative Example 1 to prepare a graphite film. The graphite film obtained in this manner was broken and the thermal diffusivity could not be measured.

The thermal diffusivity of the graphite films obtained in Examples 1 to 11 and Comparative Examples 1 to 3 is shown in Table 1.

TABLE 1

| Example | Raw material film (polymer film or carbonized film) Raw material film thickness in parentheses (*1) | Raw material film size (cm$^2$) | Heating method | Pressure to stacked carbonized films | Number of stacked film(s) | Thickness of graphite film/μm | Thermal diffusivity (×10$^{-4}$ m$^2$/sec) | Flatness of film | Removability of films from each other |
|---|---|---|---|---|---|---|---|---|---|
| Comparative Example 1 | A' (75 μm) | 400 | Atmospheric heating | Present (*2) | 10 | 40 | 8.8 | Good | Good |
| Example 1 | A' (75 μm) | 400 | Electrical heating | Present (*2) | 1 | 36 | 9.8 | Very good | — |
| Example 2 | A' (75 μm) | 400 | Electrical heating | Present (*2) | 10 | 34 | 10.3 | Very good | Good |
| Example 3 | A' (75 μm) | 400 | Electrical heating | Present (*2) | 30 | 33 | 10.6 | Very good | Good |
| Example 4 | A' (75 μm) | 400 | Electrical heating | Present (*2) | 100 | 34 | 10.6 | Very good | Good |
| Example 5 | A' (75 μm) | 400 | Electrical heating | Present (*3) | 10 | 35 | 10.4 | Good | Good |
| Example 6 | A' (75 μm) | 400 | Electrical heating | None | 10 | 36 | 10.0 | Good | Very good |
| Example 7 | A'' (125 μm) | 400 | Electrical heating | Present (*2) | 10 | 57 | 10.0 | Very good | Good |
| Example 8 | A''' (75 μm) (*4) | 400 | Electrical heating | Present (*2) | 30 | 34 | 10.6 | Very good | Good |
| Example 9 | A' (75 μm) | 400 | Electrical heating | Present (*5) | 30 | 34 | 10.5 | Very good | Very good |
| Example 10 | B' (75 μm) | 400 | Electrical heating | Present (*2) | 10 | 35 | 10.8 | Very good | Good |

TABLE 1-continued

| Example | Raw material film (polymer film or carbonized film) Raw material film thickness in parentheses (*1) | Raw material film size (cm²) | Heating method | Pressure to stacked carbonized films | Number of stacked film(s) | Thickness of graphite film/μm | Thermal diffusivity (×10⁻⁴ m²/sec) | Flatness of film | Removability of films from each other |
|---|---|---|---|---|---|---|---|---|---|
| Example 11 | A' (75 μm) | 400 | Electrical heating | Present (*2) | 1 | 35 | 9.5 | Good | — |
| Comparative Example 2 | A' (75 μm) | 400 | Atmospheric heating | None | 1 | 32 | 8.2 | Poor (wrinkles) | — |
| Comparative Example 3 | A' (75 μm) | 400 | Atmospheric heating | Present (*3) | 1 | — | — | Broken | — |

(*1) The raw material thickness in the table represents a thickness of a polyimide film before carbonization, that is, an uncarbonized polyimide film.
(*2) The case where the raw material film was retained in a graphite container that can reduce planar pressure to the raw material film in the graphitization step shown in FIG. 8.
(*3) The case where the raw material film was retained in a graphite jig that can reduce planar pressure to the raw material film in the graphitization step shown in FIG. 9.
(*4) The highest carbonization treatment temperature in Example 8 was 1,400° C. Further, the highest carbonization treatment temperature in Examples 1 to 7, 9 and 10 and Comparative Examples 1 to 3 was 1,000° C.
(*5) The raw material films were graphitized with a carbon material around the raw material films, the carbon material having a height smaller than the stacking height of the raw material films.

The thermal diffusivity by electrical heating in Examples 1 to 11 was higher than that by atmospheric heating in Comparative Examples 1 to 3 and was $9.5 \times 10^{-4}$ m²/sec or more, and graphite films having excellent flatness were obtained in Examples 1 to 11. The graphite films obtained by electrical heating were more excellent than those obtained by atmospheric heating, presumably because the raw material films can be uniformly heated by electrical heating rather than atmospheric heating, as described above.

Even when thick raw material films were stacked as in Example 7, graphite films having a thermal diffusivity of $10.0 \times 10^{-4}$ m²/sec could be obtained with excellent flatness.

In Comparative Examples 1 to 3 with atmospheric heating, excellent graphite films were obtained in Example 1 in which raw material films were stacked. The graphite film of Comparative Example 3 was broken but the graphite films of Comparative Example 1 were not broken, where pressure was applied to the raw material film(s) during the graphitization step. This is because breakage of the graphite films could be prevented in Comparative Example 1 by stacking raw material films to increase cushioning against pressure to the raw material films, while a single raw material film was used in Comparative Example 3. In addition, the thermal diffusivity in Comparative Example 1 was higher than that in Comparative Example 2, presumably because development of the graphite layer in the plane direction of the raw material film was promoted by applying pressure in the plane direction during the graphitization step.

<Effect of Stacking in Graphitization Step>

In Example 1 where a single raw material film was graphitized and Examples 2 to 4 where two or more stacked raw material films were graphitized, the raw material film itself was electrically heated and planarly pressurized to carry out the graphitization step, respectively. The graphite films of Examples 2 to 4 obtained from two or more stacked films were superior in thermal diffusivity to the graphite film of Example 1. This is presumably because the percentage of the raw material films occupied in a container was increased by stacking as compared with the case where a single raw material film was used; the raw material films were more electrified than the container as the films were graphitized; and therefore graphitization of the raw material films was promoted. As is clear from Examples 2 to 4, when a certain number or more of the films were stacked, there was no significant difference in thermal diffusivity according to the number of stacked films. This suggests that uniform heating to a certain extent was realized by stacking two or more films. Further, in Example 8 in which the carbonization temperature of the raw material polymer films was 1,400° C., the resulting graphite films had a thermal diffusivity similar to that of the graphite films of Example 3 in which the carbonization temperature was 1,000° C. The resulting graphite films had a similar thermal diffusivity presumably due to the effect of stacking raw material films.

The graphite films of Example 10 have most superior in thermal diffusivity among those of Examples 1 to 11, presumably because the starting material is produced by sequence control, and thus has high plane orientation to make molecular rearrangement easily occur during graphitization; and development of the graphite layer is promoted in the plane direction by applying pressure planarly in the graphitization step.

<Representation of Evaluation Results for Flatness and Removability>

Flatness and removability of the graphite films were evaluated. Table 1 shows the evaluation results by visual observation for flatness of the graphite films obtained in each example. In this table, the graphite films relatively flat without waviness were evaluated as "good", the graphite films particularly excellent were evaluated as "very good", and the graphite films having large waviness were evaluated as "poor". Removability of the resulting stacked graphite films from each other was evaluated as follows. The films that can each be removed without breakage and independently recovered were evaluated as "good", the films that can each be recovered without requiring a removal step were evaluated as "very good", the films partially broken when removed were evaluated as "fair", and the films adhered to each other and completely broken when removed were evaluated as "poor".

<Planar Pressure Reduction>

As shown in Table 1, the resulting graphite films in all Examples had excellent flatness. Graphite films having particularly excellent flatness were obtained by electrically heating the raw material film itself and thermally treating the film with pressure planarly applied to the film, and furthermore appropriately reducing the planar pressure in this planar pressurization during the thermal treatment in the graphitization step, as in Examples 1 to 4 and 7 to 10. This is presumably because expansion of the raw material film in the plane direction according to graphitization in the middle of the graphitization step more easily occurs by this planar pressure reduction.

In all Examples in which raw material films were stacked, the resulting stacked graphite films could be each independently recovered without breakage and were not adhered to each other during the graphitization step. In particular, the graphite films obtained in Examples 6 and 9 could be each independently recovered without requiring a removal step. This is presumably because the stacked raw material films were thermally treated with planar pressure not applied to the films in Example 6, and the stacked raw material films were thermally treated with a carbon material present around the films in Example 9, making it possible to prevent application of excessive pressure.

A graphite film obtained through such a graphitization step of the present invention is flexible, but a more flexible graphite film can be prepared by further compressing or rolling the resulting graphite film.

The post-planar pressurization step of the present invention will be particularly described below in detail as an example of the compression treatment or rolling treatment.

Comparative Example 4

The graphite film A after the graphitization step was pressurized at a pressure of 0.2 MPa at room temperature using single-plate press to carry out the post-planar pressurization step, with both surfaces of the film held by a polyimide film, a Teflon® film, a shock-absorbing rubber material and an iron plate. The held polyimide film was removed after the single-plate press step to recover the graphite film A after the post-planar pressurization step as an independent graphite film.

Comparative Example 5

The graphite film A after the graphitization step was first vacuumed and then pressurized at a pressure of 0.2 MPa at room temperature using vacuum press, with both surfaces of the film held by a polyimide film, a Teflon® film, a shock-absorbing rubber material and an iron plate. The held polyimide film was removed after the vacuum press step to recover the graphite film A after the post-planar pressurization step as an independent graphite film.

Example 12

The graphite film A' was pressurized at a pressure of 0.2 MPa at room temperature using single-plate press, with both surfaces of the film held by a polyimide film, a Teflon® film, a shock-absorbing rubber material and an iron plate. The held polyimide film was removed after the single-plate press step to recover the graphite film A' after the post-planar pressurization step as an independent graphite film.

Example 13

The graphite film A' was pressurized by vacuuming at room temperature using vacuum rubber press, with both surfaces of the film held by a polyimide film. The held polyimide film was removed after the vacuum rubber press step to recover the graphite film A' after the post-planar pressurization step as an independent graphite film.

Example 14

The graphite film A' was first vacuumed and then pressurized at a pressure of 0.2 MPa at room temperature using vacuum press, with both surfaces of the film held by a polyimide film, a Teflon® film, a shock-absorbing rubber material and an iron plate. The held polyimide film was removed after the vacuum press step to recover the graphite film A' after the post-planar pressurization step as an independent graphite film.

Example 15

The graphite film B' was first vacuumed and then pressurized at a pressure of 0.2 MPa at room temperature using vacuum press, with both surfaces of the film held by a polyimide film, a Teflon® film, a shock-absorbing rubber material and an iron plate. The held polyimide film was removed after the vacuum press step to recover the graphite film B' after the post-planar pressurization step as an independent graphite film.

Example 16

The graphite film A' was first vacuumed and then pressurized at a pressure of 0.2 MPa at 100° C. using vacuum press, with both surfaces of the film held by a polyimide film, a Teflon® film, a shock-absorbing rubber material and an iron plate. The held polyimide film was removed after the vacuum press step to recover the graphite film A' after the post-planar pressurization step as an independent graphite film.

Example 17

The thirty graphite films A' were pressurized at a pressure of 0.2 MPa at room temperature using single-plate press, with both surfaces of the films held by a polyimide film, a Teflon® film, a shock-absorbing rubber material and an iron plate. The thirty graphite films were recovered after the single-plate press step as the thirty independent graphite films A' after the post-planar pressurization step.

Example 18

The thirty graphite films A' were first vacuumed and then pressurized at a pressure of 0.2 MPa at room temperature using vacuum press, with both surfaces of the films held by a polyimide film, a Teflon® film, a shock-absorbing rubber material and an iron plate. The thirty graphite films were recovered after the vacuum press step as the thirty independent graphite films A' after the post-planar pressurization step.

Example 19

The thirty graphite films A' and twenty-nine graphite sheets obtained from natural graphite were alternately placed and were first vacuumed and then pressurized at a pressure of 0.2 MPa at room temperature using vacuum press, with both surfaces of the whole held by a polyimide film, a Teflon® film, a shock-absorbing rubber material and an iron plate. The alternately placed graphite sheets were removed after the vacuum press step to recover the thirty graphite films as the thirty independent graphite films A' after the post-planar pressurization step.

Example 20

The thirty graphite films A' and twenty-nine polyimide films were alternately placed and were first vacuumed and then pressurized at a pressure of 0.2 MPa at room temperature using vacuum press, with both surfaces of the whole held by a polyimide film, a Teflon® film, a shock-absorbing rubber material and an iron plate. The alternately placed polyimide films were removed after the vacuum press step to recover the thirty graphite films as the thirty independent graphite films A' after the post-planar pressurization step.

Comparative Example 6

The graphite film A was rolled through two metal pressure rollers to obtain a graphite film.

The thermal diffusivity of the graphite films obtained in Examples 12 to 20 and Comparative Examples 4 to 6 is shown in Table 2. Properties of a graphite film manufactured by Matsushita Electric Industrial Co., Ltd. (EYGS182510) are also shown as Reference Example.

TABLE 2

| Example | Raw material film | Graphitization method | Processing method | Thermal diffusivity ($10^{-4}$ m$^2$/S) | Density (g/cm$^3$) | Appearance Flaws and wrinkles | Recesses | Flatness |
|---|---|---|---|---|---|---|---|---|
| Comparative Example 4 | 75 μm polyimide film A | Atmospheric heating | Press | 7.4 | 1.60 | Good | Fair | Good |
| Comparative Example 5 | 75 μm polyimide film A | Atmospheric heating | Vacuum press | 7.6 | 1.75 | Good | Fair | Very good |
| Example 12 | 75 μm polyimide film A' | Electrical heating | Press | 9.5 | 1.80 | Good | Good | Good |
| Example 13 | 75 μm polyimide film A' | Electrical heating | Vacuum rubber press | 9.7 | 1.80 | Good | Good | Very good |
| Example 14 | 75 μm polyimide film A' | Electrical heating | Vacuum press | 9.8 | 1.85 | Good | Good | Very good |
| Example 15 | 75 μm polyimide film B' | Electrical heating | Vacuum press | 10.0 | 1.88 | Good | Good | Very good |
| Example 16 | 75 μm polyimide film A' | Electrical heating | Vacuum press at 100° C. | 10.2 | 1.90 | Good | Good | Very good |
| Example 17 | 75 μm polyimide film A' | Electrical heating | Press after stacking | 9.5 | 1.80 | Very good | Good | Good |
| Example 18 | 75 μm polyimide film A' | Electrical heating | Vacuum press after stacking | 9.8 | 1.90 | Very good | Good | Very good |
| Example 19 | 75 μm polyimide film A' | Electrical heating | Vacuum press after stacking | 9.6 | 1.80 | Very good | Good | Very good |
| Example 20 | 75 μm polyimide film A' | Electrical heating | Vacuum press after stacking | 9.8 | 1.90 | Very good | Good | Very good |
| Comparative Example 6 | 75 μm polyimide film A | Atmospheric heating | Rolling by metal rollers | 7.1 | 1.10 | Poor | Poor | Fair |
| Reference Example | Graphite film manufactured by Matsushita Electric Industrial Co., Ltd. | | | 7.1 | 1.10 | Fair | Poor | Fair |

Flaws and wrinkles of the graphite films were evaluated by visual observation. The graphite films without flaws and wrinkles were evaluated as "Good", the graphite films particularly excellent were evaluated as "Very Good", the graphite films having either linear flaws or wrinkles observed were evaluated as "Fair", and the graphite films having both linear flaws and wrinkles observed were evaluated as "Poor".

Recesses of the graphite films were evaluated by visual observation. The graphite films not recessed were evaluated as "Good", the graphite films partially recessed were evaluated as "Fair", and the graphite films wholly recessed were evaluated as "Poor".

Flatness of the graphite films was evaluated by visual observation. The graphite films flat without waviness were evaluated as "good", the graphite films particularly excellent were evaluated as "very good", the graphite films having waviness observed were evaluated as "fair", and the graphite films having large waviness were evaluated as "poor".

The graphite films obtained in Examples 12 to 20 each had a thermal diffusivity of $9.5 \times 10^{-4}$ m$^2$/sec or more and thus had high thermal conductivity. On the other hand, the graphite films obtained in Comparative Examples 4 to 6 and Reference Example each had a thermal diffusivity of $7.6 \times 10^{-4}$ m$^2$/sec or less which was inferior to those in Examples 12 to 20.

In particular, the graphite films of Comparative Examples 4 and 5 were superior in thermal diffusivity to that of Comparative Example 6, presumably because the film was rolled through metal rollers in Comparative Example 6 to apply shear force to the film, so that the graphite layer was broken and the thermal diffusivity was reduced, while the films were planarly pressurized in Comparative Examples 4 and 5, so that the graphite layer was not broken and was planarly stretched to provide the films with an excellent thermal diffusivity in the plane direction.

The graphite film of Comparative Example 5 was superior in thermal diffusivity to that of Comparative Example 4, presumably because the film was pressurized using vacuum press in Comparative Example 5, so that air between layers of the graphite was removed and the air heat insulation layer was reduced.

The graphite films obtained in Examples 12 to 20 were superior in thermal diffusivity to the graphite films obtained in Comparative Examples 4 and 5. In these Examples, the film was retained in an electrifiable container and graphitized with the container electrified by application of voltage. As a result, since the raw material film was also electrically heated, the inside and the surface of the film were uniformly heated due to contribution of heat generation of the raw material film itself, and the film was sufficiently uniformly heated from the periphery of the film. Therefore, the graphite layer was grown more significantly than in the conventional art, and a graphite film having excellent electrical conductivity and thermal conductivity could be obtained, presumably. On the other hand, in Comparative Examples 4 to 6, since the raw material film was heated in an inert gas atmosphere, heating is carried out from the surface of the film by heat conduction from a part in contact with a heater or atmospheric gas or radiation heat from a heater, so that the inside and the surface of the film was non-uniformly graphitized and thermal conductivity of the whole film was reduced, presumably.

The graphite film obtained in Example 15 was superior to the graphite film obtained in Example 14. The graphite film of Example 15 was superior, presumably because the starting material of Example 15 had higher plane orientation and was produced by sequence control, so that molecular rearrangement easily occurs during graphitization. Further, since the starting material had a higher carbon ratio as the starting material had a higher degree of plane orientation, the amount of decomposition gas was small and the starting material was smoothly graphitized, presumably.

The graphite films obtained in Examples 12 to 20 had a density higher than those of the graphite films obtained in Comparative Examples 4 to 6 and Reference Example. In addition, the graphite films had a small variation in density in the plane.

In particular, the graphite films of Comparative Examples 4 and 5 had a density higher than to that of Comparative Example 6, presumably because the graphite film was rolled through two metal rollers in Comparative Example 6, so that the film was linearly pressurized from up and down and could not be compressed on the whole surface, making it difficult to increase the density, while the films were planarly pressurized in Comparative Examples 4 and 5, so that the graphite layer was not broken and was planarly stretched, making it possible to obtain graphite films having a high density.

The graphite film of Comparative Example 5 was superior in density to that of Comparative Example 4, presumably because the film was pressurized using vacuum press in Comparative Example 5, so that air between layers of the graphite was effectively removed.

The graphite films obtained in Examples 12 to 20 had a density higher than those of the graphite films obtained in Comparative Examples 4 and 5. In these Examples, since the films were graphitized while electrified, graphite films could be obtained with a graphite layer grown further than in conventional graphite films, presumably. As a result, when the graphite film having a graphite layer grown was planarly pressurized, the graphite layer was effectively planarly widened and a graphite film having a high density was obtained, presumably.

The graphite films obtained in Comparative Examples 4 and 5 and Examples 12 to 20 had flaws and wrinkles on the surface fewer than in the graphite films obtained in Comparative Example 6 and Reference Example.

In particular, the graphite films of Comparative Examples 4 and 5 had flaws and wrinkles fewer than in the graphite film of Comparative Example 6, because the graphite films were rolled through two metal rollers to apply shear force to the films by linear pressurization from up and down, so that the graphite films easily had wrinkles in a part where strength in the plane significantly varied. The films had flaws originating from partial wrinkles in some cases. Further, in rolling treatment with the rollers, the graphite films were removed and the removed graphite films were attached to the rollers, so that the graphite films had flaws during rolling in some cases.

In Examples 7 to 20, graphite films not defected without flaws and wrinkles were obtained. This is presumably because the graphite films were cushioning materials uniformly pressurized in the plane, presumably.

The graphite films obtained in Comparative Examples 4 and 5 and Examples 12 to 20 had recesses fewer than in the graphite films obtained in Comparative Example 6 and Reference Example. Further, the graphite films obtained in Examples 12 to 20 had recesses fewer than in the graphite films obtained in Comparative Examples 4 and 5.

In Comparative Examples 4 to 6, since the films were heated in an inert gas atmosphere, the inside and the surface of the films were non-uniformly graphitized; growth of the graphite layer partially varied; and partial defects easily occurred due to decomposition gas generated or rearrangement during graphitization. Therefore, even after rolling treatment and pressurization treatment, the films were generally flat but had recesses at a depth of 1 mm or less visually observed.

On the other hand, in Examples 12 to 20, since the films were graphitized by electrification, the graphite films had a graphite layer grown in the plane more uniformly than in conventional graphite films, and recesses were not generated even after rolling or pressurization treatment, so that graphite films without recesses could be obtained.

The graphite films of Comparative Examples 4 and 5 had recesses fewer than in the graphite film of Comparative Example 6, because the graphite film of Comparative Example 6 was rolled through two metal rollers to apply shear force to the film by linear pressurization from up and down, so that recesses could not be eliminated. On the other hand, when the films were planarly pressurized, recesses were filled and thus invisible, presumably.

The graphite films obtained in Examples 12 to 20 were superior in flatness to the graphite films obtained in Comparative Example 6 and Reference Example. Further, the graphite films obtained in Comparative Example 5, Examples 13 to 16 and Examples 18 to 20 had particularly excellent flatness.

The graphite films of Comparative Examples 4 and 5 were superior in flatness to the graphite film of Comparative Example 6, because the graphite film of Comparative Example 6 was rolled through two metal rollers to apply shear force to the film by linear pressurization from up and down. The graphite film had inferior strength and was supported by two upper and lower points of the rollers during rolling, so that the film was easily distorted after rolling treatment. On the other hand, since the whole surface of the film was fixed during planar pressurization, a graphite film having excellent flatness without distortion could be easily obtained.

The graphite films of Comparative Example 5, Examples 13 to 16 and Examples 18 to 20 had particularly excellent flatness, presumably because the whole films were uniformly pressurized by performing vacuum treatment before pressurization.

In the case of vacuum press, a graphite film having excellent flatness without flaws, recesses and wrinkles on the surface could be obtained by carrying out first vacuuming and then pressurization rather than carrying out vacuuming and pressurization at the same time.

The graphite film prepared in Example 5 and the graphite film of Comparative Example 7 described later were tested for the thickness, thickness variation, density, surface roughness Ra, coefficient of linear expansion, tensile strength and tensile modulus of elasticity, thermal diffusivity in the plane direction according to an AC method, thermal diffusivity and thermal conductivity in the thickness direction by a laser flash method, thermal resistance and thermal conductivity in the thickness direction by a thermal resistance measuring apparatus, MIT flexural fatigue resistance, pencil hardness and winding around a pencil, and were observed using a cross-sectional SEM image.

Comparative Example 7

The graphite film of Example 7 was a commonly available PGS graphite sheet "EYGS182310" manufactured by Matsushita Electric Industrial Co., Ltd. and was presumably a film obtained by graphitizing KAPTON® 300H, a polyimide film manufactured by Du Pont-Toray Co., Ltd., by atmospheric heating, according to the description of a known document or the like.

(Thickness, Thickness Variation and Density)

The thickness of any points of the graphite film was measured by MT1201 and ND221B manufactured by Heidenhain Corporation. The thickness of the graphite film was an average of measured values at any ten points, and the difference between the highest value and the lowest value among thickness values at any twenty points was a variation in thickness. The density of the graphite film was calculated by dividing the weight (g) of the graphite film by the volume ($cm^3$) of the graphite film calculated as a product of the length, width and thickness of the film. As the density is higher, graphitization is assumed to be more significant. The graphite film prepared in Example 5 had a variation in thickness of 2.5 μm and a density of 1.9 $g/cm^3$, and the graphite film of Comparative Example 7 had a thickness of 65 μm, a variation in thickness of 11.3 μm and a density of 1.2 $g/cm^3$.

(Surface Roughness Ra)

The surface roughness Ra of the graphite film was a value obtained according to JIS B0601 and was specifically measured using a surface roughness measuring instrument SE3500 (manufactured by Kosaka Laboratory Ltd.). Specifically, the graphite film was cut into a length of 100 m×m×a width of 200 mm, and a chart was drawn with a cutoff of 0.8 mm and a chart speed of 2 mm/s. A part having a reference length L was extracted from the chart. The surface roughness is a value obtained by the following formula 5 in μm units when the roughness curve is represented by Y=f(X) where the X axis represents the center line of the extracted part and the Y axis represents the longitudinal direction of the extracted part. This measurement was carried out three times with a reference length (L) of 80 mm and the average was determined as a surface roughness Ra. As the value of surface roughness Ra is smaller, the graphite film has more excellent surface flatness. The graphite film of the present invention has a surface roughness Ra of preferably 2.5 μm or less, and more preferably 2.5 μm or less, taking into consideration adhesion to the heat generation site and adhesion of the complexed graphite film to the complexed layer. The graphite film prepared in Example 5 had a surface roughness Ra of 2.3 μm, and the graphite film of Comparative Example 7 had a surface roughness Ra of 2.9 μm.

[Formula 5]

$$Ra = (1/L) \int^L |f(X)| dx \quad (5)$$

(Coefficient of Linear Expansion)

The coefficient of linear expansion in the plane direction of the graphite film was measured using a thermomechanical analyzer TMA-50 manufactured by Shimadzu Corporation. Specifically, the coefficient of a graphite film sample cut into a length of 3×20 mm was measured in a tensile mode in a nitrogen atmosphere at an initial loading of 10 g, with the sample heated from room temperature to 400° C. at a heating rate of 10° C./min. The average of values at 100° C. to 200° C. was used as a representative coefficient of linear expansion. The graphite film prepared in Example 5 had a coefficient of linear expansion of −1.8 ppm, and the graphite film of Comparative Example 7 had a coefficient of linear expansion of 0.1 ppm.

(Tensile Strength and Tensile Modulus of Elasticity)

The tensile strength and tensile modulus of elasticity of the graphite film were measured three times in accordance to ASTM-D-882 at room temperature with a distance between chucks of 100 mm and a tensile speed of 50 mm/min, using Strograph VES1D manufactured by Toyo Seiki Seisaku-Sho, Ltd.; the average of three measured values was used as a measurement result. The graphite film prepared in Example 5 had a tensile strength of 27.5 MPa and a tensile modulus of elasticity of 1.2 GPa, and the graphite film of Comparative Example 7 had a tensile strength of 20.0 MPa and a tensile modulus of elasticity of 0.7 GPa.

(Thermal Diffusivity in Plane Direction According to AC Method)

The progression of graphitization can be evaluated based on the thermal diffusivity in the plane direction of the film. As the thermal diffusivity is higher, graphitization is more significant. In the present application, the thermal diffusivity was be measured using a thermal diffusivity meter according to an AC method ("LaserPit" available from ULVAC-RIKO, Inc.). Specifically, the graphite film was cut into a 4×40 mm sample and the thermal diffusivity was measured in an atmosphere at 20° C. at 10 Hz. The graphite film prepared in Example 5 had a thermal diffusivity in the plane direction of $10.0 \times 10^{-4}$ m²/s, and the graphite film of Comparative Example 4 had a thermal diffusivity in the plane direction of $7.2 \times 10^{-4}$ m²/s.

(Thermal Diffusivity and Thermal Conductivity in Thickness Direction by Laser Flash Method)

The thermal diffusivity and thermal conductivity in the thickness direction of the graphite film were measured by a laser flash method using LFA-502 manufactured by Kyoto Electronics Manufacturing Co., Ltd. in accordance with JIS R1611-1997. Specifically, the graphite film was cut into a diameter of 10 mm, both surfaces of the film were blackened, and then the thermal diffusivity and thermal conductivity were measured at room temperature. The heat capacity of the graphite film was calculated from comparison with a reference standard substance Mo having a known heat capacity. The thermal conductivity in the thickness direction of the graphite film was calculated from the results of measuring the thermal diffusivity in the thickness direction, the density and the heat capacity of the graphite film. The graphite film prepared in Example 5 had a thermal diffusivity in the thickness direction of 4.8 mm²/s and a thermal conductivity in the thickness direction of 6.8 W/m·K, and the graphite film of Comparative Example 4 had a thermal diffusivity in the thickness direction of 8.6 mm²/s and a thermal conductivity in the thickness direction of 7.8 W/m·K.

(Thermal Resistance and Thermal Conductivity in Thickness Direction)

The thermal resistance and thermal conductivity in the thickness direction of the graphite film were measured using a resin material thermal resistance measuring apparatus I-Engineering manufactured by Hitachi, Ltd., under conditions where the graphite film was cut into a 10 mm square and held between mirror surfaces of a 0.525 mm-thick silicon chip; oil was applied between a heating shaft and a cooling shaft; the sample temperature was 50° C.; and a constant loading mode at 20 N was used. The thermal resistance in the thickness direction of the film can be measured in a contact manner by this method. The thermal resistance was an average of three measurement values, and the thermal conductivity in the thickness direction was calculated from the value. The graphite film prepared in Example 5 had a thermal resistance in the thickness direction of 0.48° C./W and a thermal conductivity in the thickness direction of 1.1 W/m·K, and the graphite film of Comparative Example 7 had a thermal resistance in the thickness direction of 0.53° C./W and a thermal conductivity in the thickness direction of 1.6 W/m·K.

(MIT Flexural Fatigue Resistance)

An MIT flexural fatigue resistance test was carried out for the graphite film. Specifically, the test was carried out for the graphite film cut into 1.5×10 cm using an MIT flexural fatigue resistance tester type-D manufactured by Toyo Seiki Seisaku-Sho, Ltd. with a test load of 100 gf (0.98 N), a speed of 90 times/min and a bending radius R of 5 mm. The bending angle in the test was 45° in the transverse direction. The graphite film prepared in Example 5 and the graphite film of Comparative Example 7 were both tested 10,000 times or more until being cut.

(Pencil Hardness)

The pencil hardness of the graphite film was evaluated according to 8.4.1 Testing machine method in "Testing methods for paints" of JIS K 5400 (1990) (JIS K 5600 (1999)). The evaluation value was represented by a pencil hardness such as 2B, B, HB or H. The surface hardness is higher in this order. The graphite film prepared in Example 5 has a pencil hardness of HB or higher and thus has high surface hardness.

(Test for Winding Around Pencil)

Winding of the graphite film around a pencil was tested in order to examine flexibility of the graphite film. Specifically, the graphite film was cut into 3×5 cm and wound around a pencil having a diameter of 7 mm with a round cross-sectional shape. The cut graphite film was wound in the 5 cm long side direction around the pencil to the last, and then appearance of the film was visually observed. The film not broken was evaluated as "windable", and the film broken was evaluated as "not windable". The graphite film prepared in Example 5 and the graphite film of Comparative Example 7 were both "windable".

(Cross-Sectional SEM Image Observation)

A cross-sectional SEM image of the graphite film was observed using a scanning electron microscope S-4500 manufactured by Hitachi, Ltd. at an acceleration voltage of 5 kV. A sample for the image was prepared as follows. The graphite film was cut into a strip having a length of 20 mm and a width of 10 mm with a cutter knife. Then, a tiny incision was made on one edge of the cut film in the plane direction with a razor. Force was applied to the incision from the opposed side of the film to cut the incision off, thereby revealing the cross-section of the film.

Figure 10:
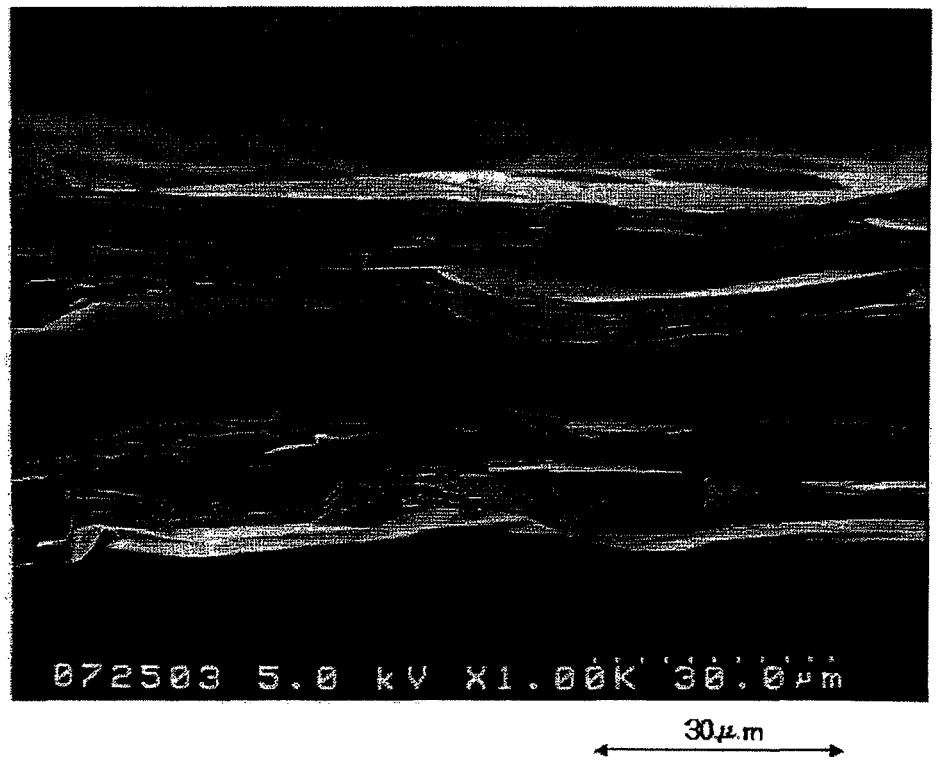
FIG. 10 is a cross-sectional SEM image of a graphite film of Example 5.

FIG. 10 shows a cross-sectional SEM image of the graphite film of Example 5. In the whole film plane of the graphite film of Example 1, the surface layer has a structure in which single graphite layers are each formed to have an approximately rectangular shape with a short side length of 5 μm or more by stacking approximate rectangles each having a thickness of less than 1 μm approximately parallel to each other, and the single graphite layers are extremely densely stacked to have an approximately rectangular shape with a short side length of 10 μm or more, that is, have a thickness of 10 μm or more. Specifically, the surface layer has a cross-sectional pattern as a dense graphite layer which has graphite crystallites developed in the plane direction and stacked, and a layer other than the surface layer has a cross-sectional pattern as a graphite layer which has graphite crystallites developed in the plane direction but not stacked and is rich in air layers. That is, the graphite film of the present invention includes a graphite film having a part with a surface layer and a layer other than the surface layer differing at least in cross-sectional pattern. Due to this structure, the graphite film of the present invention has high thermal conductivity, and has excellent crystallinity of the graphite layer so that the film has a density of 1.9 g/cm$^3$ or more which is higher than that of the graphite film of Comparative Example 7.

Figure 11:
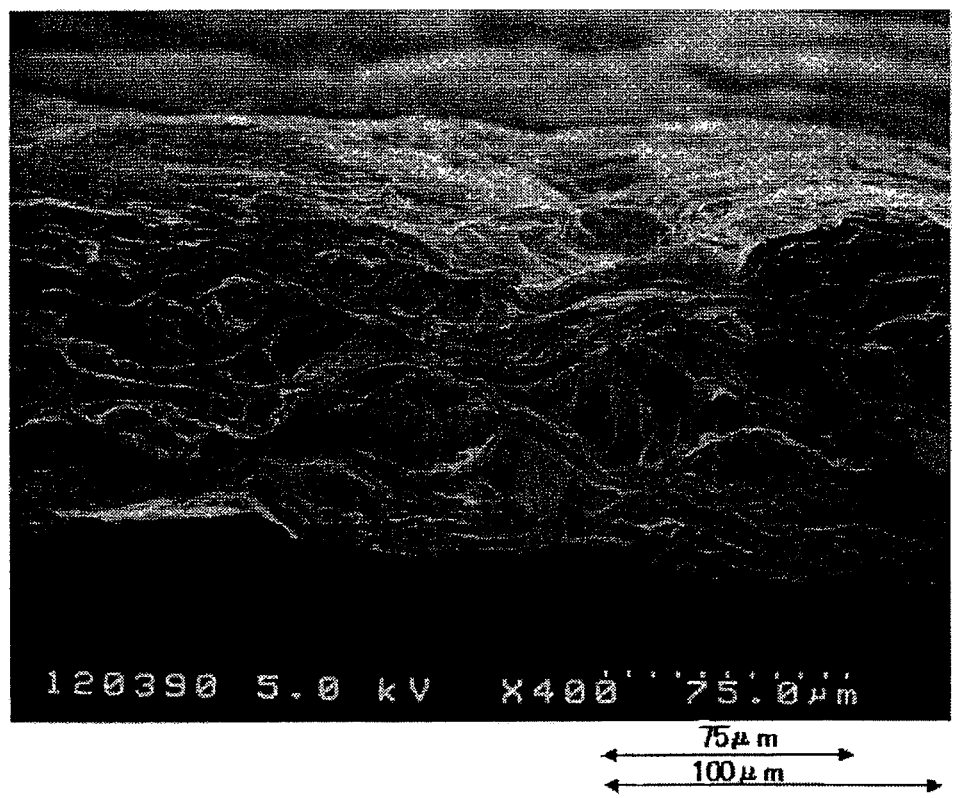
FIG. 11 is a cross-sectional SEM image of a graphite film of Comparative Example 7.

On the other hand, the graphite film of Comparative Example 7 is presumably prepared by thermally treating a polyimide film as a raw material. However, as is shown in FIG. 11 which is a cross-sectional SEM image of the graphite film, graphite crystallites are developed in the plane direction but are almost present as single layers and not stacked, and the film is wavy and has a low density.

As described above, the graphite film of the present invention has a coefficient of linear expansion of 0 ppm or less, a tensile modulus of elasticity of 1 GPa or more, and a thermal conductivity in the contact thickness direction of 1.4 W/m·K or less measured by a thermal resistance measuring apparatus. Therefore, when used for a heat sink or the like, the dimension of the graphite film is not changed even by a change in temperature during heating or cooling of a heat generation component; the film has sufficient strength even if the film is thin; the film can rapidly transfer heat from a heat generation component; graphite can be prevented from being removed from the surface. Therefore, the film provides a heat radiation component with high adhesion to a pressure sensitive adhesive, an adhesive or a heat generation component, with low pollution and with no flaws on the surface. In particular, since the graphite film of the present invention has a coefficient of linear expansion of 0 ppm or less, the film can compensate thermal expansion when bonded to one or more common materials having a coefficient of linear expansion of 0 ppm or more. Further, since thermal diffusivity in the plane direction and thermal diffusivity in the thickness direction are considerably anisotropic and the thermal diffusivity is more excellent in the plane direction than in the thickness direction, the film can diffuse heat from a heat generation part preferentially in the plane direction and can suppress generation of heat spots.

The invention claimed is:

1. A process for producing a graphite film comprising the steps of:
   graphitizing a raw material film made of a polymer film and/or a carbonized polymer film; and
   conducting a post-planar pressurization step after the step of graphitizing, so that a planar pressure is uniformly and simultaneously applied to the graphitized raw material film, wherein
   the graphitized raw material film is pressurized together with a film-like medium other than the graphitized raw material film in the post-planar pressurization step, thereby reducing wrinkles on the graphitized raw material,
   the graphitization step includes thermal treatment at a temperature of 2,400° C. or higher, and
   the raw material film is retained in and in contact with a container that is directly electrified by application of voltage and graphitized while electrifying the container by application of voltage in the graphitization step.

2. The process for producing a graphite film according to claim 1, wherein the container that can be directly electrified by application of voltage is a graphite container.

3. The process for producing a graphite film according to claim 2, wherein the graphitization step is carried out with carbon powder packed between the graphite container and the raw material film and/or around the outer periphery of the graphite container.

4. The process for producing a graphite film according to claim 1, wherein the carbonized polymer film is obtained by a carbonization step of thermally treating a polymer film at a temperature of 600 to 1,800° C.

5. The process for producing a graphite film according to claim 1, wherein the graphitization step is carried out in the state where the two or more raw material films are stacked.

6. The process for producing a graphite film according to claim 5, wherein the number of the stacked films is ten or more in the state where the two or more raw material films are stacked.

7. The process for producing a graphite film according to claim 5, wherein the graphitization step is carried out in the state where the two or more raw material films are stacked and a carbon material having a height smaller than the height of the stacked films is present around the stacked films.

8. The process for producing a graphite film according to claim 1, wherein the post-planar pressurization step is carried out by using a single plate.

9. The process for producing a graphite film according to claim 1, wherein the pressurization is carried out by vacuum press in the post-planar pressurization step.

10. The process for producing a graphite film according to claim 1, wherein the multiple graphitized raw material films are simultaneously pressurized in the post-planar pressurization step.

11. The process for producing a graphite film according to claim 10, further comprising an independent recovery step of recovering the multiple graphitized raw material films planarly pressurized as independent graphite films after the post-planar pressurization step.

12. A process for producing a graphite film comprising the steps of:
graphitizing a raw material film made of a polymer film and/or a carbonized polymer film; and
conducting a post-planar pressurization step after the step of graphitizing, so that a planar pressure is uniformly and simultaneously applied to the graphitized raw material film, wherein
the multiple graphitized raw material films are simultaneously pressurized in the post-planar pressurization step, thereby reducing wrinkles on the graphitized raw material, and
the process further comprises the independent recovery step of recovering the multiple graphitized raw material films planarly pressurized as independent graphite films after the post-planar pressurization step,
the graphitization step includes thermal treatment at a temperature of 2,400° C. or higher, and
the raw material film is retained in and in contact with a container that is directly electrified by application of voltage and graphitized while electrifying the container by application of voltage in the graphitization step.

13. The process for producing a graphite film according to claim 12, wherein the container that can be directly electrified by application of voltage is a graphite container.

14. The process for producing a graphite film according to claim 13, wherein the graphitization step is carried out with carbon powder packed between the graphite container and the raw material film and/or around the outer periphery of the graphite container.

15. The process for producing a graphite film according to claim 12, wherein the carbonized polymer film is obtained by a carbonization step of thermally treating a polymer film at a temperature of 600 to 1,800° C.

16. The process for producing a graphite film according to claim 12, wherein the graphitization step is carried out in the state where the two or more raw material films are stacked.

17. The process for producing a graphite film according to claim 16, wherein the number of the stacked films is ten or more in the state where the two or more raw material films are stacked.

18. The process for producing a graphite film according to claim 16, wherein the graphitization step is carried out in the state where the two or more raw material films are stacked and a carbon material having a height smaller than the height of the stacked films is present around the stacked films.

19. The process for producing a graphite film according to claim 12, wherein the pressurization is carried out by single-plate press in the post-planar pressurization step.

20. The process for producing a graphite film according to claim 12, wherein the pressurization is carried out by vacuum press in the post-planar pressurization step.

21. The process for producing a graphite film according to claim 12, wherein the graphitized raw material film is pressurized together with a film-like medium other than the graphitized raw material film in the post-planar pressurization step.

22. The process for producing a graphite film according to claim 1, wherein the step of graphitizing the raw material film is conducted by applying a planner pressure.

23. The process for producing a graphite film according to claim 12, wherein the step of graphitizing the raw material film is conducted by applying a planner pressure.

24. A process for producing a graphite film comprising a step of graphitizing a raw material film made of a polymer film and/or a carbonized polymer film and a post-planar pressurization step for planarly pressurizing the graphitized raw material film after the step of graphitizing, wherein
the graphitized raw material film is pressurized together with a film-like medium other than the graphitized raw material film in the post-planar pressurization step,
the raw material film is retained in and in contact with a container that can be directly electrified by application of voltage and graphitized while electrifying the container by application of voltage in the graphitization step,
the container that can be directly electrified by application of voltage is a graphite container, and
the graphitization step is carried out with carbon powder packed between the graphite container and the raw material film and/or around the outer periphery of the graphite container.

25. A process for producing a graphite film comprising a step of graphitizing a raw material film made of a polymer film and/or a carbonized polymer film and a post-planar pressurization step for planarly pressurizing the graphitized raw material film after the step of graphitizing, wherein
the graphitized raw material film is pressurized together with a film-like medium other than the graphitized raw material film in the post-planar pressurization step, wherein
the graphitization step is carried out in the state where the two or more raw material films are stacked, and
the graphitization step is carried out in the state where the two or more raw material films are stacked and a carbon material having a height smaller than the height of the stacked films is present around the stacked films.

26. A process for producing a graphite film comprising the step of graphitizing a raw material film made of a polymer film and/or a carbonized polymer film and a post-planar pressurization step for planarly pressurizing the graphitized raw material film after the step of graphitizing, wherein
the multiple graphitized raw material films are simultaneously pressurized in the post-planar pressurization step,
the process further comprises the independent recovery step of recovering the multiple graphitized raw material films planarly pressurized as independent graphite films after the post-planar pressurization step,
the raw material film is retained in and in contact with a container that can be directly electrified by application of voltage and graphitized while electrifying the container by application of voltage in the graphitization step,
the container that can be directly electrified by application of voltage is a graphite container, and
the graphitization step is carried out with carbon powder packed between the graphite container and the raw material film and/or around the outer periphery of the graphite container.

27. A process for producing a graphite film comprising the step of graphitizing a raw material film made of a polymer film and/or a carbonized polymer film and a post-planar pressurization step for planarly pressurizing the graphitized raw material film after the step of graphitizing, wherein the multiple graphitized raw material films are simultaneously pressurized in the post-planar pressurization step,
the process further comprises the independent recovery step of recovering the multiple graphitized raw material films planarly pressurized as independent graphite films after the post-planar pressurization step,
the graphitization step is carried out in the state where the two or more raw material films are stacked, and
the graphitization step is carried out in the state where the two or more raw material films are stacked and a carbon material having a height smaller than the height of the stacked films is present around the stacked films.

\* \* \* \* \*